(12) United States Patent
Koga et al.

(10) Patent No.: US 6,218,683 B1
(45) Date of Patent: Apr. 17, 2001

(54) DIODE

(75) Inventors: Shinji Koga, Tokyo; Kazuhiro Morishita, Fkuoka; Katsumi Satoh, Tokyo, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/463,407

(22) PCT Filed: Jun. 1, 1998

(86) PCT No.: PCT/JP98/02427

§ 371 Date: Feb. 1, 2000

§ 102(e) Date: Feb. 1, 2000

(87) PCT Pub. No.: WO99/63597

PCT Pub. Date: Dec. 9, 1999

(51) Int. Cl.$^7$ .......................... H01L 29/74; H01L 31/111
(52) U.S. Cl. .......................... 257/156; 257/610; 257/611
(58) Field of Search .................................. 257/156, 610, 257/611, 133

(56) References Cited

U.S. PATENT DOCUMENTS

| | | | |
|---|---|---|---|
| 3,988,771 | * | 10/1976 | Krishna . |
| 4,165,517 | | 8/1979 | Temple et al. . |
| 4,281,336 | * | 7/1981 | Sommer et al. . |
| 4,752,818 | * | 6/1988 | Kushida et al. . |
| 5,144,402 | * | 9/1992 | Minato . |
| 5,151,766 | | 9/1992 | Hueppi . |
| 6,031,276 | * | 2/2000 | Osawa et al. . |

FOREIGN PATENT DOCUMENTS

| | | |
|---|---|---|
| 0 368 768 | 5/1990 | (EP) . |
| 0 709 898 | 5/1996 | (EP) . |
| 0 797 257 | 9/1997 | (EP) . |
| 58-114468 | 7/1983 | (JP) . |
| 3-229471 | 10/1991 | (JP) . |
| 7-297414 | 11/1995 | (JP) . |

OTHER PUBLICATIONS

Josef Lutz, "The Freewheeling Diode—No Longer the Weak Component", PCIM 1997, Power Conversion, pp. 259–265.
K. Satoh, et al., "4.5kV Soft Recovery Diode With Carrier Stored Structure", ISPSD 1998 pp. 313–316.
Patent Abstracts of Japan, vol. 005, No. 141 (E–073), Sep. 5, 1981, JP 56–078127, Jun. 26, 81.
Patent Abstracts of Japan, vol. 018, No. 240 (E–1545), May 9, 1994, JP 6–029558, Feb. 4, 1994.

* cited by examiner

Primary Examiner—Stephen D. Meier
(74) Attorney, Agent, or Firm—Oblon, Spivak, McClelland, Maier & Neustadt, P.C.

(57) ABSTRACT

The present invention relates to a diode, and has an object to simultaneously implement a high di/dt capability, a low reverse recovery loss and a low forward voltage and to suppress generation of voltage oscillation. In order to achieve the above-mentioned object, life time killers are selectively introduced into a semiconductor substrate (20) comprising a P layer (1), an N$^-$ layer (21) and an N$^+$ layer (3). A density of the introduced life time killers is the highest in a first region (6) adjacent to the P layer (1), and is the second highest in a second region (7) in the N$^-$ layer (21). The life time killers are not introduced into a third region (2). Accordingly, a life time in the N$^-$ layer (21) is expressed by the first region (6)<the second region (7)<the third region (2). The second region (7) and the third region (2) are adjacent to the P layer (1). In addition, the second region (7) annularly surrounds the third region (2).

17 Claims, 22 Drawing Sheets

| CHARACTERISTIC | FIRST EMBODIMENT | SECOND EMBODIMENT | THIRD EMBODIMENT | CONVENTIONAL EXAMPLE 1 | CONVENTIONAL EXAMPLE 2 |
|---|---|---|---|---|---|
| FORWARD VOLTAGE | SLIGHTLY HIGH | SLIGHTLY HIGH | LOW | HIGH | LOW |
| REVERSE RECOVERY CURRENT | SMALL | SMALL | LARGE | LARGE | SMALL |
| ATTENUATION OF REVERSE RECOVERY CURRENT | SLIGHTLY SLOW | QUICK | QUICK | QUICK | SLOW |
| di/dt CAPABILITY | HIGH | HIGH | SLIGHTLY LOW | LOW | HIGH |
| REVERSE RECOVERY LOSS | SMALL | SMALL | LARGE | SMALL | LARGE |
| SUPPRESSION OF OSCILLATION | GOOD | GOOD | EQUAL TO CONVENTIONAL EXAMPLE 2 | VERY POOR | POOR |

$$Q = \frac{1}{R} \cdot \sqrt{\frac{L}{C}}$$

DIODE

TECHNICAL FIELD

The present invention relates to a diode suitable for a free wheel diode to be used together with a high breakdown voltage switching element such as an IGBT (Insulated Gate Bipolar Transistor), a GCT (Gate Commutated Turn-off Thyristor) or the like, or suitable for a high breakdown voltage clamp diode or the like.

BACKGROUND ART

FIGS. 36 and 37 are a sectional front view and a plan view which show a conventional diode as the background of the present invention, respectively. FIG. 36 is a sectional view taken along the line E—E in FIG. 37. A diode 151 comprises, as a main part, a semiconductor substrate 80 using silicon as a base material. The semiconductor substrate 80 has a P layer 81, an N⁻ layer 82 and an N⁺ layer 83 provided sequentially from an upper main surface to a lower main surface.

An anode electrode 84 is connected to the upper main surface of the semiconductor substrate 80, that is, an exposed surface of the P layer 81, and a cathode electrode 85 is connected to the lower main surface of the semiconductor substrate 80, that is, an exposed surface of the N⁺ layer 83. These electrodes 84 and 85 are formed of an electrically conductive metal. Furthermore, life time killers which are crystal defects for promoting the annihilation of carriers as the recombination centers of the carriers are introduced into the semiconductor substrate 80. Thereby the life time of the carrier is controlled.

FIG. 38 is a graph showing a profile of a density of the life time killers introduced into the semiconductor substrate 80. In the conventional diode 151, two kinds of profiles have been known. In a conventional example 1 represented by a curve Pr1 shown in FIG. 38, the life time killers are uniformly introduced over the whole semiconductor substrate 80. Accordingly, the life time of the N⁻ layer 82 is uniformly controlled.

On the other hand, in a conventional example 2 corresponding to a curve Pr2, the life time killers are selectively introduced into a region of the N⁻ layer 82 adjacent to a junction interface between the N⁻ layer 82 and the P layer 81. Consequently, the life time of the region adjacent to the junction interface between the N⁻ layer 82 and the P layer 81 is locally controlled to be short. A diode corresponding to the conventional example 2 is a device which has been disclosed in the International Conference PCIM '97 (International POWER CONVERSION '97 CONFERENCE NURNBERG, GERMANY Jun. 10–12, 1997).

Immediately after operating conditions are instantaneously changed by the switching operation of an external circuit from a state in which a current flows to a diode in a forward direction to a state in which a reverse bias is applied, a reverse current transiently flows to the diode. FIG. 39 is a graph showing a waveform of a current flowing in the diode in the transient state in relation to both the conventional examples 1 and 2. At a time t0, when a switching operation is performed from a state in which a forward current $I_F$ steadily flows to a state in which a reverse bias is applied, a current starts to be decreased. The current is continuously decreased to have a negative value in a short time. In other words, a reverse current (minus current) flows to the diode.

Even if the switching operation is performed to apply a reverse bias, a depletion layer is not immediately formed in a PN junction between the P layer 81 and the N⁻ layer 82 due to excess carriers remaining in the vicinity of the PN junction. For this reason, the diode is transiently brought into a conductive state. As a result, the reverse current flows. An increase rate of the reverse current in an initial stage, that is, (an absolute value of) a current decrease rate represented by di/dt in FIG. 39 is defined by the magnitude of an inductance acting as a load in the external circuit. If the inductance is increased, the current decrease rate di/dt is increased. Correspondingly, the reverse current is rapidly increased.

In a process in which the reverse current is increased, a depletion layer is generated at a time t1. The depletion layer is formed in the PN junction as shown in FIG. 40. A front 92 of a depletion layer 91 advances toward the N⁺ layer 83 with the passage of a time. Consequently, the depletion layer 91 is enlarged to cover the whole N⁻ layer 82 shortly.

Returning to FIG. 39, as the depletion layer 91 is generated and grows, a reverse voltage v is generated at the time t1 between the anode electrode 84 and the cathode electrode 85, and then the reverse voltage v is increased to shortly converge on a value of a reverse bias applied from the outside. More specifically, when the depletion layer 91 grows, a reverse voltage blocking capability which is the original function of the diode is recovered. FIG. 39 typically shows only the reverse voltage v related to the conventional example 2.

When the reverse voltage v is increased, the reverse current gradually reduces the speed of the increase, and shortly reaches a peak and is then decreased. As the current decrease rate di/dt is increased, the peak is increased. A value of the peak is referred to as a reverse recovery current $I_{rr}$, and is one of parameters for evaluating a reverse recovery characteristic in the diode. The reverse current converges on zero while continuing the decrease. Thus, a transient state, that is, a reverse recovery operation comes to an end, and a steady state in which the reverse voltage v is equal to the reverse bias and the reverse current does not flow is realized.

As the parameter for evaluating the reverse recovery characteristic, an attenuation rate of the reverse recovery current, a di/dt capability and a reverse recovery loss have been known in addition to the above-mentioned reverse recovery current $I_{rr}$.

The attenuation rate of the reverse recovery current is defined as a rate of convergence on zero after the reverse current passes through a peak in the graph of FIG. 39. The di/dt capability is a maximum value of the current decrease rate di/dt which can be applied without causing a damage on the diode. Moreover, the reverse recovery loss is a magnitude of a loss caused on the diode in the process of the reverse recovery operation.

If the reverse recovery current $I_{rr}$ is smaller, it is possible to resist a greater current decrease rate di/dt. Accordingly, a simple relationship is established between the reverse recovery current $I_{rr}$ and the current decrease rate di/dt. Moreover, the reverse recovery loss is equivalent to a time integral of a product of the reverse current and the reverse voltage v in the graph of FIG. 39. Accordingly, if the magnitude of the reverse recovery current $I_{rr}$ is smaller and the attenuation of the reverse recovery current is performed more quickly, the reverse recovery loss is more reduced. As a matter of course, it is desirable that the magnitude of the reverse recovery current I, should be smaller, the attenuation of the reverse recovery current should be performed more quickly and the di/dt capability should be larger. Furthermore, it is desirable that the reverse recovery loss should be as small as possible.

In the diode according to the conventional example 1, the life time killers are introduced over the whole semiconductor substrate 80. Therefore, the attenuation of the reverse recovery current is performed quickly as shown in the curve Pr1 of FIG. 39. Consequently, there is an advantage that the reverse recovery loss is small. However, the magnitude of the reverse recovery current $I_{rr}$ is large. As a result, there has been a problem in that the di/dt capability is small. In addition, there has been a problem in that a forward voltage acting as a significant parameter for evaluating a forward characteristic is high.

In the diode according to the conventional example 2, the life time killers are locally introduced in the vicinity of the PN junction at a higher density than in the conventional example 1. Consequently, the life time of the carriers is controlled to be short in the vicinity of the PN junction. Therefore, the recombination of the excess carriers is performed quickly in the vicinity of the PN junction. For this reason, the formation of the depletion layer 91 is promoted. Thus, the magnitude of the reverse recovery current $I_{rr}$ is small as shown in the curve Pr2 of FIG. 39. As a result, it is possible to obtain an advantage that the di/dt capability is high.

Furthermore, the life time killers are not introduced into a region of the N⁻ layer 82 excluding the vicinity of the PN junction. Therefore, the forward voltage is also advantageously low. More specifically, not only the di/dt capability but also the forward characteristic is more improved in the diode according to the conventional example 2 than in the conventional example 1.

However, since the life time killer is not introduced into the region of the N⁻ layer 82 excluding the vicinity of the PN junction, after the depletion layer 91 is generated during the reverse recovery operation, the depletion layer 91 grows slowly. In the diode according to the conventional example 2, therefore, the attenuation of the reverse recovery current is performed slowly as shown in the curve Pr2 of FIG. 39. As a result, there has been another problem in that a reverse recovery loss is large.

As will be described below, furthermore, both the conventional examples 1 and 2 have had a common problem in that oscillation is easily caused at the last stage of the reverse recovery operation. The oscillation is caused as that of the reverse voltage v in an oscillation region Osc as shown in FIG. 39. Although FIG. 39 illustrates only the reverse voltage v according to the conventional example 2, the oscillation is caused more remarkably in the conventional example 1.

When the time t1 passes in the process of the reverse recovery operation, the depletion layer 91 is generated and then grows as shown in FIG. 40. During this process, the diode 151 can be equivalently represented by a series circuit formed by a capacitor having a pair of electrodes opposed to each other with the depletion layer 91 interposed therebetween and a leak resistor in the depletion layer 91 as shown in FIG. 41. In the process of the reverse recovery operation, accordingly, a series resonance circuit is equivalently constituted by the combination of a capacitance C of the capacitor, a resistance R corresponding to the leak resistor and an inductance L existing in an external circuit. In FIG. 41, a Q value of the resonance circuit is expressed by an equation. An oscillating phenomenon does not occur while the Q value is small.

The capacitance C is defined by a thickness of the deletion layer 91 and a density of the excess carriers, and the resistance R is defined by a leak current in the depletion layer 91 and a recombination current of the excess carrier. As a result, when the depletion layer 91 is enlarged, the capacitance C and the resistance R are changed in a waveform illustrated in a graph of FIG. 42. More specifically, the capacitance C is generated with the generation of the depletion layer 91, and is then increased and is shortly decreased through a peak. Thereafter, the capacitance C converges on zero which is a steady value. On the other hand, the resistance R is generated with the generation of the depletion layer 91, and is then increased steadily and is rapidly raised particularly in the last stage of the reverse recovery operation.

As shown in FIG. 41, as the resistance R and the capacitance C are increased, the Q value is reduced. Accordingly, when the capacitance C converges at zero in the last stage of the reverse recovery operation, the Q value becomes large if the resistance R is not sufficiently large correspondingly. Consequently, the oscillation of the voltage is caused. Based on such a mechanism, the diodes according to the conventional examples 1 and 2 have had a problem in that the voltage oscillation is easily caused at the last stage of the reverse recovery operation. The oscillation is easily caused particularly when the magnitude of the forward current is small and that of the reverse recovery current Ir is large. When the voltage oscillation is caused, the diode acts as a noise source for peripheral circuits.

In the diode according to the prior art, thus, there has been a problem in that it is difficult to simultaneously implement a high di/dt capability, a low reverse recovery loss and a low forward voltage. Furthermore, there has been a problem in that voltage oscillation is easily caused at a certain stage of the reverse recovery operation.

DISCLOSURE OF THE INVENTION

In order to solve the above-mentioned problems, it is an object of the present invention to simultaneously implement a high di/dt capability, a low reverse recovery loss and a low forward voltage and to prevent voltage oscillation from being caused.

A first aspect of the present invention is directed to a diode comprising a semiconductor substrate defining an upper main surface and a lower main surface, a first main electrode connected to the upper main surface, and a second main electrode connected to the lower main surface. The semiconductor substrate includes first and second semiconductor layers sequentially provided from the upper main surface toward the lower main surface.

The first semiconductor layer has a first conductivity type and is exposed to the upper main surface, and the second semiconductor layer has a second conductivity type and forms a PN junction together with the first semiconductor layer. In addition, the second semiconductor layer is divided into first, second and third regions.

Furthermore, the first region faces the first semiconductor layer, and the second region and the third region occupy a portion in the second semiconductor layer which is adjacent to the first region and is close to the lower main surface, and divide the portion each other in a direction parallel with the upper main surface. A life time of carriers in the second semiconductor layer is set shorter in the first region and the second region than in the third region.

A second aspect of the present invention is directed to the diode according to the first aspect of the present invention, wherein the semiconductor substrate further includes a third semiconductor layer (3) which is adjacent to the second semiconductor layer and is exposed to the lower main surface, the third semiconductor layer having a second conductivity type and a higher impurity concentration than the second semiconductor layer.

A third aspect of the present invention is directed to the diode according to the first aspect of the present invention, wherein the life time is set longer in the second region than in the first region.

A fourth aspect of the present invention is directed to the diode according to the first aspect of the present invention, wherein a ratio of the second region to the third region is 50% or more.

A fifth aspect of the present invention is directed to the diode according to the first aspect of the present invention, wherein the second region is divided into a plurality of unit regions in the direction parallel with the upper main surface.

A sixth aspect of the present invention is directed to the diode according to the first aspect of the present invention, wherein the portion of the second semiconductor layer is divided into a plurality of regions arranged from a center toward an outside in the direction parallel with the upper main surface in such a manner that one of the regions is sequentially surrounded by a next one, and the second region and the third region are alternately arranged in each of the regions.

A seventh aspect of the present invention is directed to a diode comprising a semiconductor substrate defining an upper main surface and a lower main surface, a first main electrode connected to the upper main surface, and a second main electrode connected to the lower main surface. The semiconductor substrate includes first, second and third semiconductor layers sequentially provided from the upper main surface toward the lower main surface.

Moreover, the first semiconductor layer has a first conductivity type and is exposed to the upper main surface, the second semiconductor layer has a second conductivity type and forms a PN junction together with the first semiconductor layer, the third semiconductor layer has a second conductivity type, has a higher impurity concentration than the second semiconductor layer, and is exposed to the lower main surface, and the second semiconductor layer is sequentially divided into first, second and third regions from the first semiconductor layer toward the third semiconductor layer.

Furthermore, a boundary interface between the second semiconductor layer and the third semiconductor layer includes a portion retreating toward the lower main surface so that the third semiconductor layer includes a thick portion and a thin portion, and a life time of carriers in the second semiconductor layer is set shorter in the second region than in the third region, and is set shorter in the first region than in the second region.

An eighth aspect of the present invention is directed to the diode according to the seventh aspect of the present invention, wherein a ratio of an area occupied by a region where the thin portion is projected to the lower main surface is set to 50% or less.

A ninth aspect of the present invention is directed to the diode according to the seventh aspect of the present invention, wherein the thin portion is divided into a plurality of portions which are uniformly arranged at regular intervals along the lower main surface.

A tenth aspect of the present invention is directed to the diode according to the seventh aspect of the present invention, wherein a maximum diameter of each of the plurality of portions along the lower main surface is set to 50% or less.

An eleventh aspect of the present invention is directed to the diode according to the seventh aspect of the present invention, wherein a distance from a boundary between the second region and the third region to the lower main surface is set smaller than a thickness of the thick portion.

A twelfth aspect of the present invention is directed to a diode comprising a semiconductor substrate defining an upper main surface and a lower main surface, a first main electrode connected to the upper main surface, and a second main electrode connected to the lower main surface. The semiconductor substrate includes first, second and third semiconductor layers sequentially provided from the upper main surface toward the lower main surface.

Moreover, the first semiconductor layer has a first conductivity type and is exposed to the upper main surface, the second semiconductor layer has a second conductivity type and forms a PN junction together with the first semiconductor layer, the third semiconductor layer has a second conductivity type, has a higher impurity concentration than the second semiconductor layer, and is exposed to the lower main surface, and the second semiconductor layer is sequentially divided into first, second and third regions from the first semiconductor layer toward the third semiconductor layer.

Furthermore, a boundary surface between the first semiconductor layer and the second semiconductor layer includes a portion retreating toward the upper main surface so that the first semiconductor layer includes a thick portion and a thin portion, and a life time of carriers in the second semiconductor layer is set shorter in the second region than in the third region and is set shorter in the first region than in the second region.

A thirteenth aspect of the present invention is directed to the diode according to the twelfth aspect of the present invention, wherein a ratio of an area occupied by a region where the thin portion is projected to the upper main surface is set to 50% or less.

A fourteenth aspect of the present invention is directed to the diode according to the twelfth aspect of the present invention, wherein the thin portion is divided into a plurality of portions which are uniformly arranged at regular intervals along the lower main surface.

A fifteenth aspect of the present invention is directed to the diode according to the twelfth aspect of the present invention, wherein a maximum diameter of each of the plurality of portions along the upper main surface is set to 50% or less.

A sixteenth aspect of the present invention is directed to the diode according to the twelfth aspect of the present invention, wherein a distance from a boundary between the first region and the second region to the upper main surface is set larger than a thickness of the thick portion.

A seventeenth aspect of the present invention is directed to the diode according to the twelfth aspect of the present invention, wherein a boundary surface between the second semiconductor layer and the third semiconductor layer includes a portion retreating toward the lower main surface so that the third semiconductor layer includes a thick portion and a thin portion.

According to the first aspect of the present invention, the life time is set short in the first region adjacent to the first semiconductor layer. Therefore, a reverse recovery current can be reduced. Since the second region has a life time set short, the attenuation of the reverse recovery current can be promoted. Furthermore, since the third region has a life time set long, a forward voltage can be kept at a comparatively small value. In other words, it is possible to simultaneously implement a high di/dt capability, a low reverse recovery loss and a low forward voltage. Moreover, a reverse current concentrates more easily in the third region having a long life time than in the second region having a short life time. Therefore, the annihilation of carriers is caused with difficulty at the last stage of a reverse recovery operation. As a result, oscillation can be suppressed effectively.

According to the second aspect of the present invention, the third semiconductor layer is provided. Therefore, it is possible to suppress a punch through to raise a breakdown voltage while reducing a thickness of the semiconductor substrate.

According to the third aspect of the present invention, the life time of the second region is set longer than that of the first region. Therefore, the forward voltage can be reduced still more.

According to the fourth aspect of the present invention, the ratio of the second region to the third region is 50% or more. Therefore, a reverse recovery loss can be reduced more effectively.

According to the fifth aspect of the present invention, the second region is divided into a plurality of unit regions in the direction parallel with the upper main surface. Therefore, a heat loss generated on the semiconductor substrate can be dispersed effectively. In other words, the uniformity of the heat loss can be enhanced.

According to the sixth aspect of the present invention, the second and third regions are alternately provided in each of the regions arranged from the inside toward the outside. Therefore, the distribution of the heat loss is not biased. As a result, uniformity thereof can be enhanced. Furthermore, when three or more regions are provided and at least one of the second and third regions is divided, the dispersion of the heat loss can be promoted, resulting in a further enhancement in the uniformity of the heat loss.

According to the seventh aspect of the present invention, the life time is set short in the first region adjacent to the first semiconductor layer. Therefore, a reverse recovery current can be reduced. Since the second region has a life time set short, the attenuation of the reverse recovery current can be promoted. Furthermore, since the life time of the second region is set longer than that of the first region, a forward voltage can be kept at a comparatively small value. In other words, it is possible to simultaneously implement a high di/dt capability, a low reverse recovery loss and a low forward voltage. Moreover, a boundary surface between the second semiconductor layer and the third semiconductor layer has the portion retreating toward the lower main surface of the semiconductor substrate. In this portion, therefore, the annihilation of carriers is caused with difficulty at the last stage of a reverse recovery operation. As a result, oscillation can be suppressed effectively.

According to the eighth aspect of the present invention, the ratio of the area occupied by the region where the thin potion of the third semiconductor layer is projected to the lower main surface of the semiconductor substrate is set to 50% or less. Therefore, the forward voltage can be reduced more effectively.

According to the ninth aspect of the present invention, the thin portion of the third semiconductor layer is divided into a plurality of portions which are uniformly arranged at regular intervals along the lower main surface of the semiconductor substrate. Therefore, the convergence of the reverse current can be relieved and a blocking capability can be prevented from being reduced due to an increase in a local loss.

According to the tenth aspect of the present invention, the maximum diameter of each of the thin portions of the third semiconductor layer divided into a plurality of portions is set to 50% or less. Therefore, it is possible to effectively suppress a leak current flowing in a steady state in which a reverse voltage is applied.

According to the eleventh aspect of the present invention, the distance from the boundary between the second region and the third region to the lower main surface of the semiconductor substrate is set smaller than the thickness of the thick portion of the third semiconductor layer. Therefore, the reverse recovery loss can be reduced still more.

According to the twelfth aspect of the present invention, the concave and convex portions are provided on a PN junction interface formed between the first semiconductor layer and the second semiconductor layer. Therefore, the area of the PN junction interface can be increased and the forward voltage can be reduced. Moreover, the life time is set short in the first region adjacent to the first semiconductor layer. Therefore, an increase in a reverse recovery current caused by the concave and convex portions of the PN junction interface can be relieved. Furthermore, the attenuation of the reverse recovery current can be promoted because the second region has a short life time. In other words, it is possible to implement a low forward voltage while relieving or suppressing an increase in a di/dt capability and a reverse recovery loss.

According to the thirteenth aspect of the present invention, the ratio of the area occupied by the region where the thin portion of the first semiconductor layer is projected to the upper main surface of the semiconductor substrate is set to 50% or less. Therefore, it is possible to effectively suppress a leak current flowing in a steady state in which a reverse voltage is applied.

According to the fourteenth aspect of the present invention, the thin portion of the first semiconductor layer is divided into a plurality of portions which are uniformly arranged at regular intervals along the upper main surface of the semiconductor substrate. Therefore, the convergence of the reverse current can be relieved and a blocking capability can be prevented from being reduced due to an increase in a local loss.

According to the fifteenth aspect of the present invention, the maximum diameter of each of the thin portions of the first semiconductor layer divided into a plurality of portions is set to 50% or less. Therefore, it is possible to effectively suppress a leak current flowing in a steady state in which a reverse voltage is applied.

According to the sixteenth aspect of the present invention, the distance from the boundary between the first region and the second region to the upper main surface of the semiconductor substrate is set larger than the thickness of the thick portion of the first semiconductor layer. Therefore, an increase in the di/dt capability can be prevented more effectively from being caused by the existence of the concave and convex portions on the PN junction interface.

According to the seventeenth aspect of the present invention, both the features of the sixth and eleventh aspects are combined. Therefore, it is possible to obtain average characteristics for a di/dt capability, a speed of the attenuation of a reverse recovery current, a forward voltage and the effect of suppressing oscillation, respectively. Consequently, the range of choice for a design can be increased.

The objects, features, aspects and advantages of the present invention will be more apparent from the following detailed description and accompanying drawings.

BRIEF DESCRIPTION OF THE DRAWINGS

FIG. 33 is a table showing the quality of each of characteristics according to the first to third embodiments;

BEST MODE FOR CARRYING OUT THE INVENTION

<1. First Embodiment>

First of all, a diode according to a first embodiment will be described.

<1-1. Structure of Device>

Figure 1:
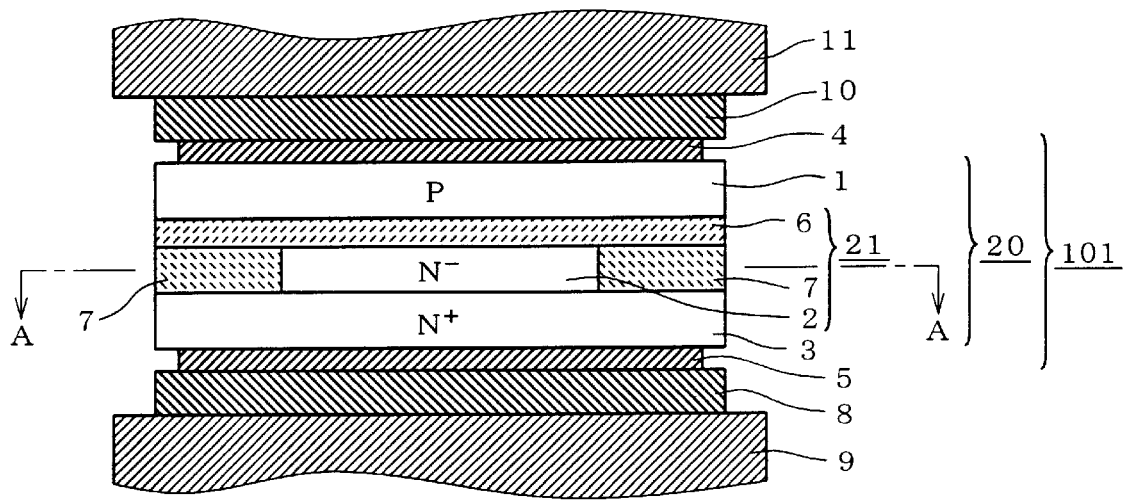
FIG. 1 is a sectional front view showing a diode according to a first embodiment.
Figure 2:
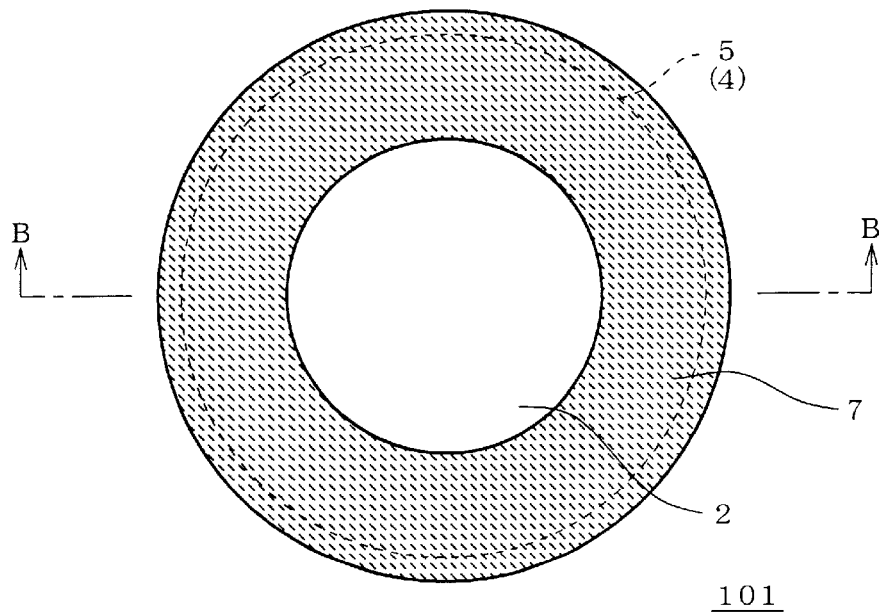
FIG. 2 is a sectional plan view showing the diode according to the first embodiment.

FIGS. 1 and 2 are a sectional front view and a sectional plan view which show a diode according to a first embodiment, respectively. A cut surface of FIG. 1 is taken along the line B—B in FIG. 2, and a cut surface of FIG. 2 is taken along the line A—A in FIG. 1. A diode 110 comprises a diode element 101 as a main member. The diode element 101 includes a semiconductor substrate 20, an anode electrode (a first main electrode) 4 and a cathode electrode (a second main electrode) 5.

The semiconductor substrate 20 is plate-shaped to define upper and lower main surfaces, and uses silicon as a base material, for example. The semiconductor substrate 20 is sequentially provided with a P layer (a first semiconductor layer) 1, an $N^-$ layer (a second semiconductor layer) 21, and an N+layer (a third semiconductor layer) 3 from the upper main surface toward the lower main surface. The P layer 1 has a P conductivity type (a first conductivity type), and the $N^-$ layer 21 and the $N^+$ layer 3 have an $N^-$ conductivity type (a second conductivity type). A higher impurity concentration is set in the $N^+$ layer 3 than in the $N^-$ layer 21.

All the P layer 1, the $N^-$ layer 21 and the $N^+$ layer 3 are plate-shaped and are provided integrally with each other to form the semiconductor substrate 20. The anode electrode 4 is connected to the upper main surface, that is, an exposed surface of the P layer 1, and the cathode electrode 5 is connected to the lower main surface, that is, an exposed surface of the $N^+$ layer 3. These electrodes 4 and 5 are formed of electrically conductive metals.

Furthermore, life time killers are selectively introduced into the semiconductor substrate 20, thereby controlling a life time of carriers. As a result, first and second regions 6 and 7 having short life times and another region, that is, a third region 2 having a long life time are defined in the $N^-$ layer 21.

The first region 6 occupies a region of the N⁻ layer 21 in the vicinity of a PN junction. More specifically, the first region 6 faces the P layer 1 to form the PN junction, and is defined as a layered region apart from the N⁺ layer 3. The second region 7 and the third region 2 are defined to mutually divide a portion of the N⁻ layer 21 excluding the first region 6, that is, a portion which faces the N⁺ layer 3 and does not face the P layer 1.

Each of the second region 7 and the third region 2 is formed like a column having the same planar sectional shape through the above-mentioned portion from the first region 6 to the N⁺ layer 3. The planar shape of the second region 7, that is, the shape of the second region 7 projected on the main surface of the semiconductor substrate 20 (each of the upper and lower main surfaces will be simply referred to as "main surface") is annular along the outer peripheral end face of the N⁻ layer 21 in examples of FIGS. 1 and 2. The third region 2 is defined as a cylindrical region surrounded by the second annular region 7.

Plate-shaped heat buffer plates 10 and 8 are in contact with the anode electrode 4 and the cathode electrode 5, respectively. Furthermore, an anode post electrode 11 and a cathode post electrode 9 are in contact with the heat buffer plates 10 and 8, respectively. When the diode 110 is to be used, the diode element 101 is pressed by the anode post electrode 11 and the cathode post electrode 9 through the heat buffer plates 10 and 8, thereby realizing an electrically and thermally good contact.

The post electrodes 11 and 9 are formed of electrically and thermally conductive metals using copper as a base material, for example, and the heat buffer plates 10 and 8 are formed of metals having a middle coefficient of thermal expansion between the post electrodes 11 and 9 and the diode element 101 (chiefly, the semiconductor substrate 20). Consequently, a heat distortion generated between the post electrodes 11 and 9 and the diode element 101 can be relieved so that an electrical and thermal contact can be kept well.

Figure 3:
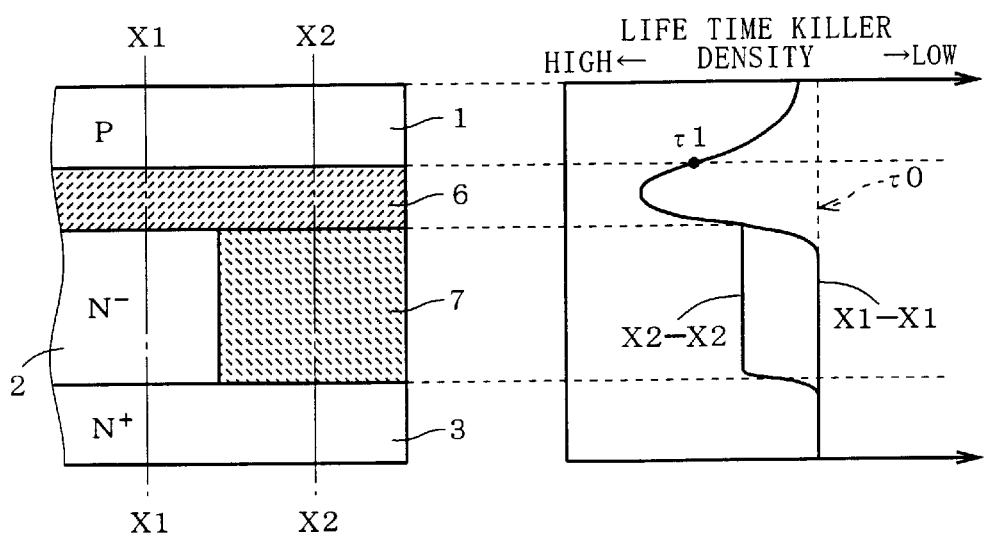
FIG. 3 is a graph showing a profile of a life time killer density according to the first embodiment.

FIG. 3 is a graph showing a profile of a density of the life time killers introduced into the semiconductor substrate 20. The graph illustrates profiles taken along both the vertical line X1—X1 penetrating the third region 2 and the vertical line X2—X2 penetrating the second region 7.

Figure 38:
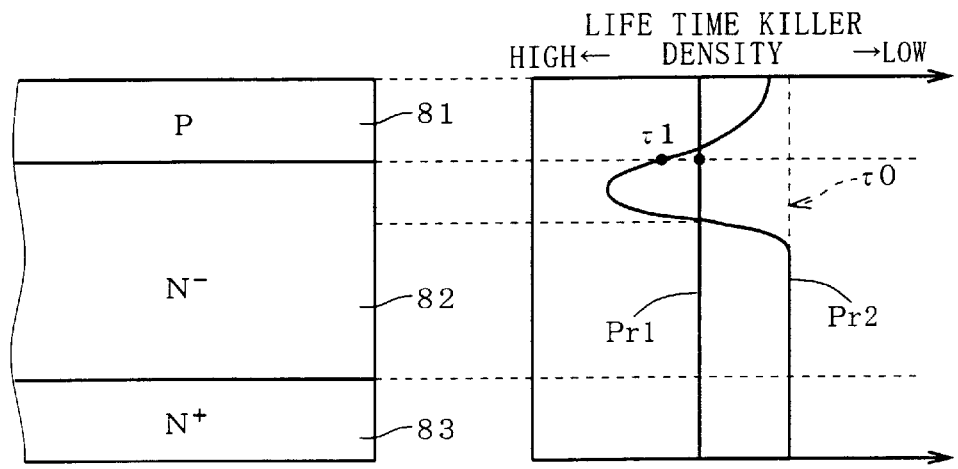
FIG. 38 is a graph showing a profile of a life time killer density according to the prior art.
Figure 39:
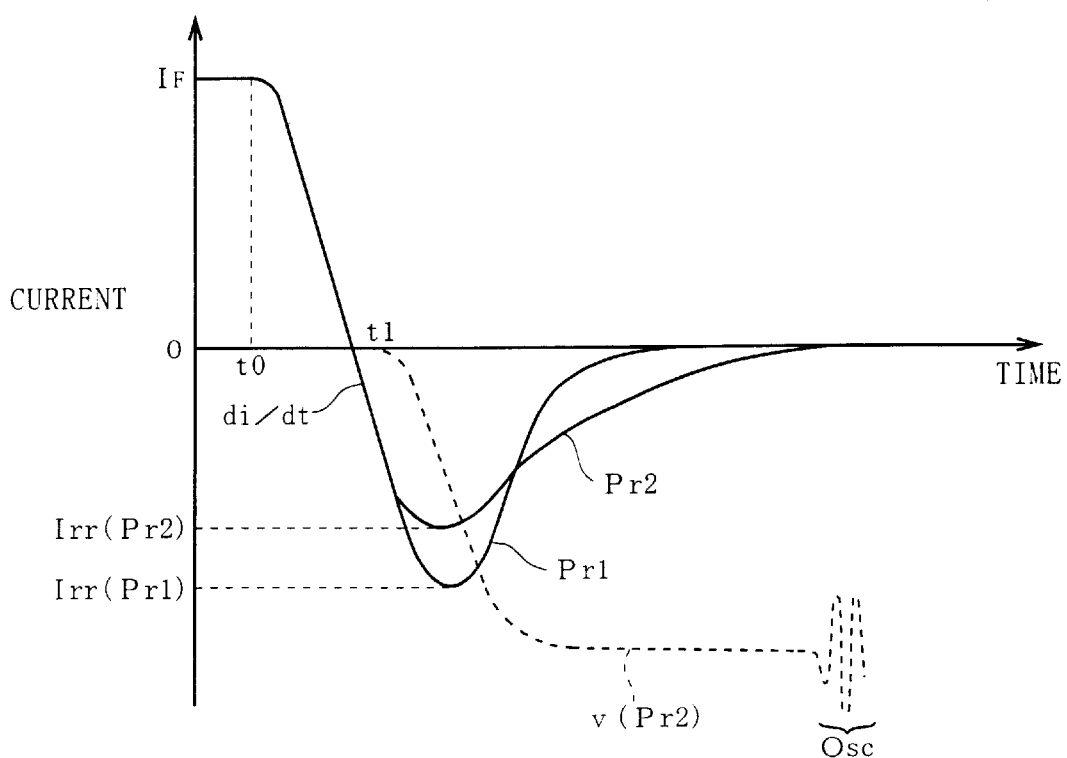
FIG. 39 is a graph showing a reverse recovery operation according to the prior art.
Figure 40:
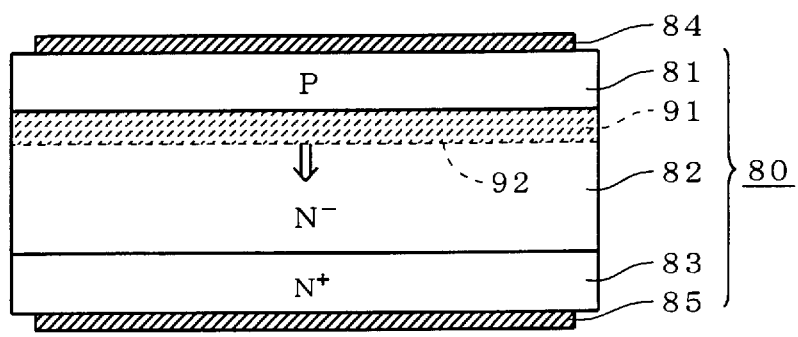
FIG. 40 is a sectional front view illustrating the reverse recovery operation according to the prior art.
Figure 41:
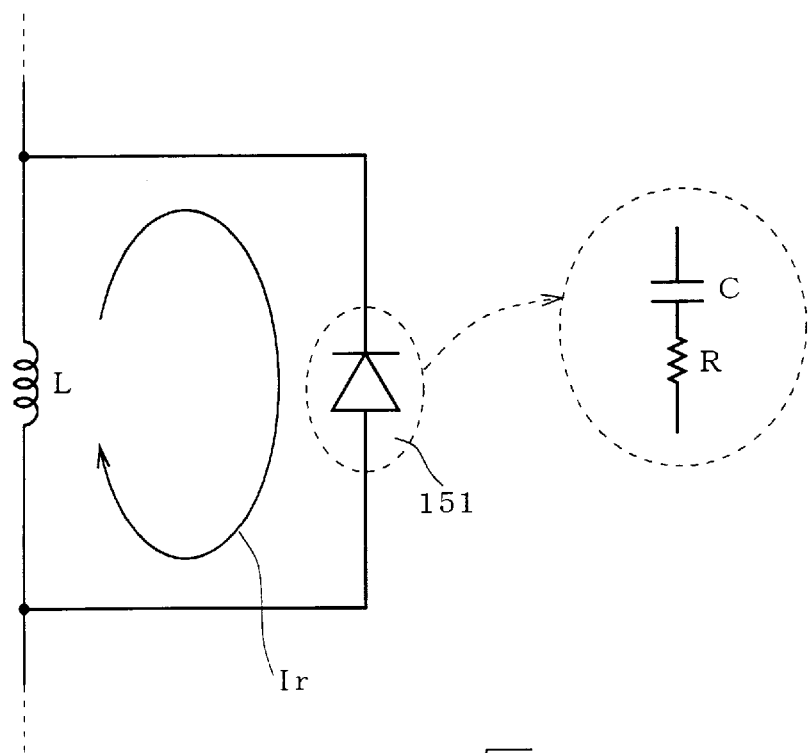
FIG. 41 is a circuit diagram illustrating the reverse recovery operation according to the prior art.
Figure 42:
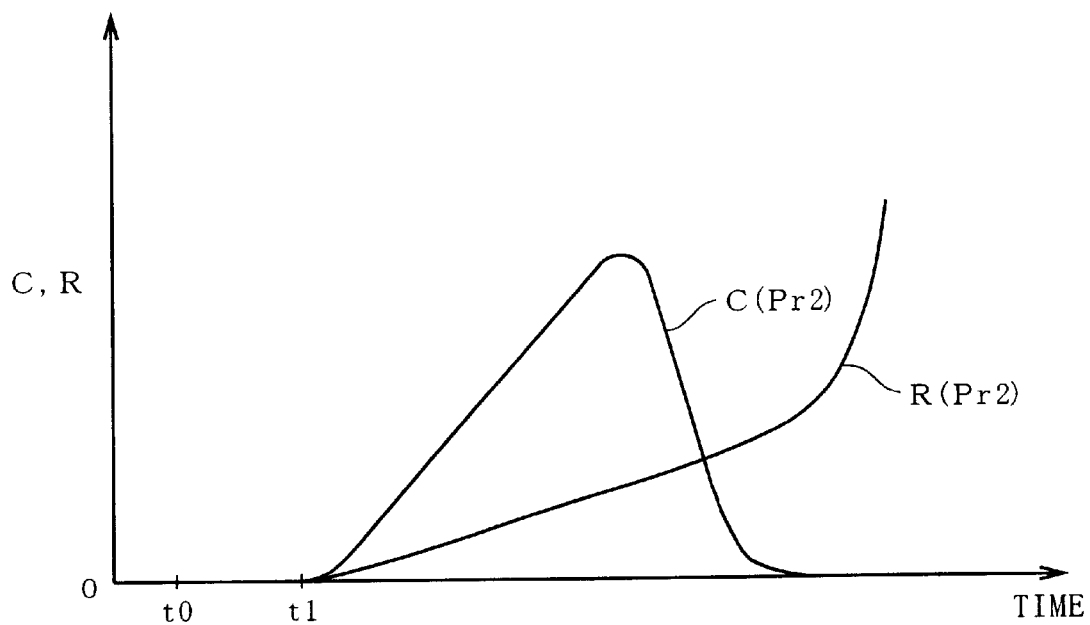
FIG. 42 is a graph showing the reverse recovery operation according to the prior art.

The profile taken along the line X1—X1 is depicted in the same curve as the curve Pr2 according to the conventional example 2 shown in FIG. 38. More specifically, the density of the life time killers is selectively high in the first region 6 including a PN junction interface. The density in the P layer 1 is also high. The reason is that the density on the PN junction interface of the first region 6 should be increased. Therefore, the density is incidentally increased also in the P layer 1 adjacent to the first region 6 in respect of a technique in which the life time killers are selectively introduced.

In the N⁻ layer 21 which has an n-conductivity type and a uniform concentration of an n-type impurity, the profile of the life time corresponds to that of the density of the life time killers. More specifically, as the density of the life time killers is increased, the life time is reduced. In the third region 2, the life time killers are not substantially introduced. In other words, an original life time τ0 of the N⁻ layer 21 is implemented in a substantial portion of the third region 2. On the other hand, the life time of the first region 6 is set shorter than the life time τ0, and a life time τ1 on the PN junction surface is also set shorter than the life time τ0.

As shown by the profile taken along the line X2—X2, the life time killers are also introduced into the second region 7. In other words, the life time of the second region 7 is set shorter than the life time τ0. Preferably, the density of the life time killers in the second region 7 is set lower than the density in the first region 6 as shown by the graph of FIG. 3. More specifically, a relationship of the life time among the three regions in the N⁻ layer 21 is desirably given by the following Equation 1.

(First region 6)<(Second region 7)<(Third region 2)  (Equation 1)

The life time of the second region 7 is set longer than that of the first region 6 for the following reason. A forward voltage should be prevented from being raised in a state in which a density of a forward current flowing in the third region 2 is not excessively increased.

In order to selectively introduce the life time killers, for example, it is sufficient that heavy metals such as gold, platinum and the like are selectively diffused into a predetermined region. Alternatively, radioactive rays such as electron beams may be selectively irradiated on the predetermined region. In order to selectively introduce the life time killers into the second region, particularly, it is desirable that the electron beams should be selectively irradiated on the second region 7. In order to perform the selective irradiation, it is sufficient that a mask having a pattern shape corresponding to the planar shape of the second region 7 is used.

<1-2. Operation of Device>

Figure 4:
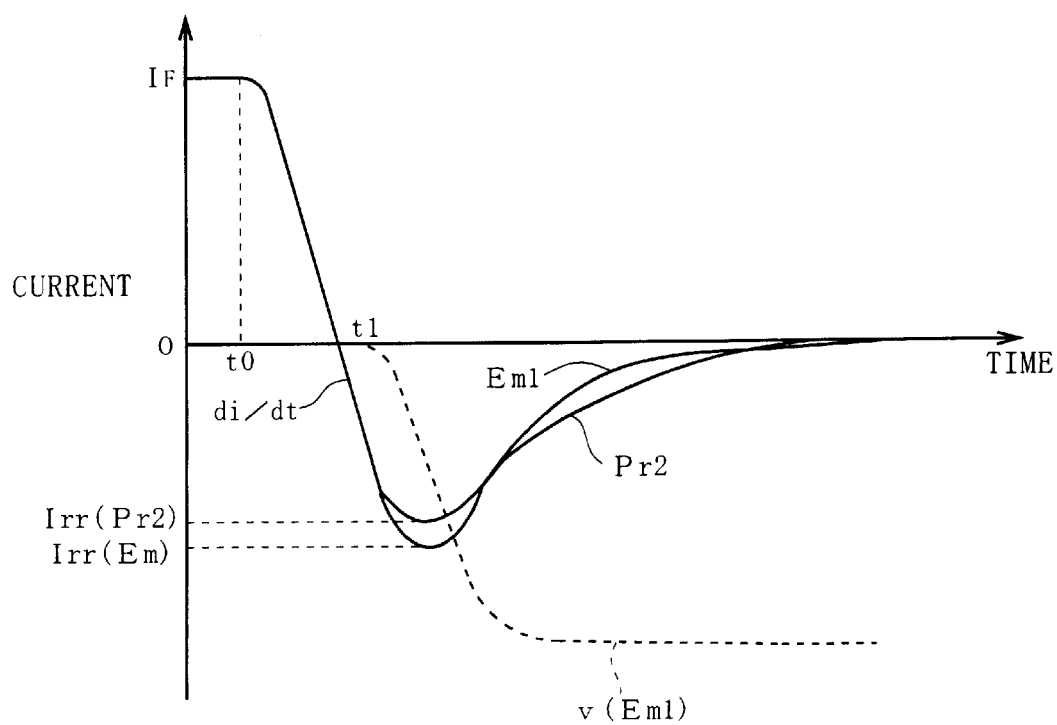
FIG. 4 is a graph showing a reverse recovery operation according to the first embodiment.

FIG. 4 is a graph showing a reverse recovery operation of the diode according to the first embodiment illustrated in FIGS. 1 to 3. In the graph, a curve Em1 represents a current waveform of the diode according to the first embodiment. For comparison, the curve Pr2 related to the diode according to the conventional example 2 is also depicted together. Furthermore, a waveform of a reverse voltage v of the diode according to the first embodiment is shown in a dotted line.

Also in the diode according to the first embodiment, the basic flow of the reverse recovery operation is the same as in the conventional examples 1 and 2. More specifically, when switching is performed from a state in which a forward current $I_F$ steadily flows to a state in which a reverse bias is applied at a time t0, a current is decreased in a negative direction. As a result, a reverse current flows. In the process in which the reverse current is increased, a depletion layer is generated on the PN junction interface at a time t1, and then grows to shortly cover the whole N⁻ layer 21. Consequently, a reverse voltage v is generated at the time t1, and is then increased and shortly converges on a value of the reverse bias applied from the outside.

With the increase in the reverse voltage v, the reverse current gradually reduces the speed of the increase, shortly passes through a peak and is then decreased. The reverse current converges on zero while continuing the decrease. Thus, a transient state, that is, the reverse recovery operation comes to an end so that a steady state in which the reverse voltage v is equal to the reverse bias and the reverse current does not flow can be implemented. As described above, the basic flow of the reverse recovery operation is the same as in the conventional examples 1 and 2. However, since the life time of the carriers in each of the first region 6 and the second region 7 is set short in the diode according to the first embodiment, the following features are revealed in a reverse recovery characteristic thereof.

More specifically, since the life time is set shorter in the first region 6, a reverse recovery current $I_{rr}$ is reduced almost equally to that in the conventional example 2. Furthermore, since the second region 7 having the life time set short is present, also in the process in which the depletion layer is enlarged beyond the first region 6, the recombination of residual carriers is promoted. For this reason, the attenuation of the reverse recovery current is more promoted than in the conventional example 2 as shown in the curve Em1 of FIG. 4. As a result, a reverse recovery loss is caused to have a smaller value than in the conventional example 2.

Figure 6:
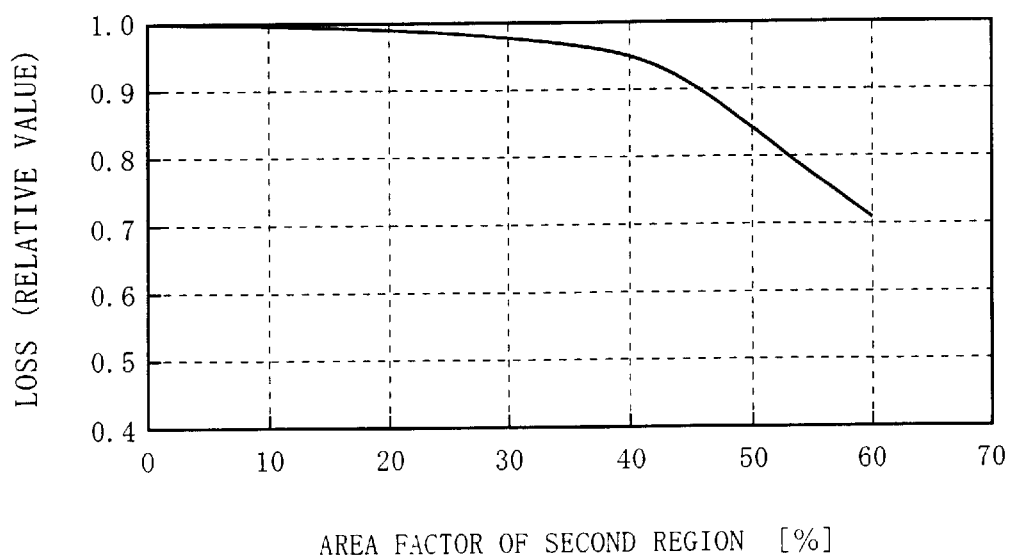
FIG. 6 is a graph showing a result of a simulation according to the first embodiment.

As an area factor of the second region 7 which is defined as a ratio of the area of the second region 7 projected on the main surface of the semiconductor substrate 20 to the area of the third region 2 projected on the main surface is increased, the reverse recovery loss is reduced. FIG. 6 is a graph showing the above-mentioned relationship which is obtained based on a simulation. It is understood from the graph that the effect of reducing the revere recovery loss is remarkably obtained when the area factor of the second region 7 exceeds 50%. Accordingly, it is desirable that the area factor of the second region 7 should be set to 50% or more.

Figure 5:
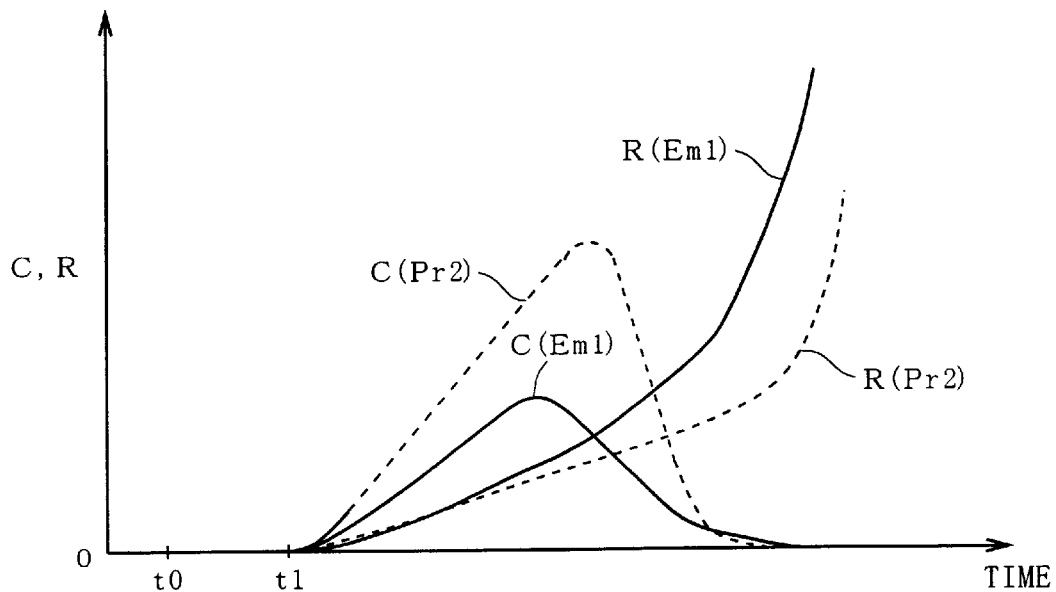
FIG. 5 is a graph showing the reverse recovery operation according to the first embodiment.

Furthermore, since the reverse current easily concentrates in the third region 2 having a long life time than in the second region 7 having a short life time, the density of the reverse current flowing in the third region 2 is more increased than in the case where the second region 7 is not provided. For this reason, the carriers are annihilated with difficulty at the last stage of the reverse recovery operation. As shown in FIG. 5, consequently, a capacitance C (Em1) equivalently formed on the semiconductor substrate 20 is larger inversely at the last stage of the reverse recovery operation than the capacitance C (Pr2) according to the conventional example 2, and keeps a finite value for a longer period of time.

In addition, a resistance R (Em1) equivalently formed on the semiconductor substrate 20 is higher than the resistance R (Pr2) according to the conventional example 2. Accordingly, the Q value of the diode according to the first embodiment is smaller at the last stage of the reverse recovery operation than in the conventional example 2. As a result, oscillation is suppressed also at the last stage of the reverse recovery operation. Consequently, the reverse voltage smoothly converges on a steady value without large oscillation as shown in the curve v (Em1) of FIG. 4.

Moreover, the density of the reverse current flowing in the third region 2 is higher than in the case where the second region 7 is not provided. Therefore, the reverse recovery current $I_{rr}$ is a little larger as shown in the curve Em1 of FIG. 4 than in the conventional example 2. However, this does not so much affect the di/dt capability as to be reduced as compared with the conventional example 2, and the di/dt capability is kept almost equal to that of the conventional example 2.

Referring to the forward current as well as the reverse current, furthermore, the current density in the third region 2 is larger than in the case where the second region 7 is not provided. Therefore, the forward voltage has a little higher value than in the conventional example 2. However, the forward voltage can have a fully smaller value than in the conventional example 1 as long as the area factor of the second region 7 is not set excessively large.

As described above, it is possible to simultaneously implement a high di/dt capability, a low reverse recovery loss and a low forward voltage in the diode according to the first embodiment. Furthermore, the voltage oscillation can be prevented in the process of the reverse recovery operation.

As described above, moreover, the third region 2 and the second region 7 have such planar shapes (which are projected on the main surface of the semiconductor substrate 20) as to be symmetrical with respect to the center of the main surface and as to cause the second annular region 7 to surround the third circular region 2. Consequently, the distribution of a heat loss caused by the forward current and the reverse current is not biased. In addition, the heat loss is effectively dispersed from the diode element 101 to the post electrodes 11 and 9 and the like provided on the outside thereof.

Furthermore, the anode electrode 4 and the cathode electrode 5 are formed to cover almost the whole main surface including a portion in the main surface of the semiconductor substrate 20 where the second region 7 is projected. Therefore, a heat loss generated in the semiconductor substrate 20 is dispersed more effectively from the diode element 101 to the post electrodes 11 and 9 and the like provided on the outside thereof.

<1-3. Variant Related to Planar Shape of Second Region>

FIGS. 7 to 14 show various variants related to the planar shape of the second region 7. FIGS. 7, 9, 11 and 13 are sectional views taken along the line B—B in FIGS. 8, 10, 12 and 14, respectively. Moreover, FIGS. 8, 10, 12 and 14 are sectional views taken along the line A—A in FIGS. 7, 9, 11 and 13, respectively.

Figure 7:
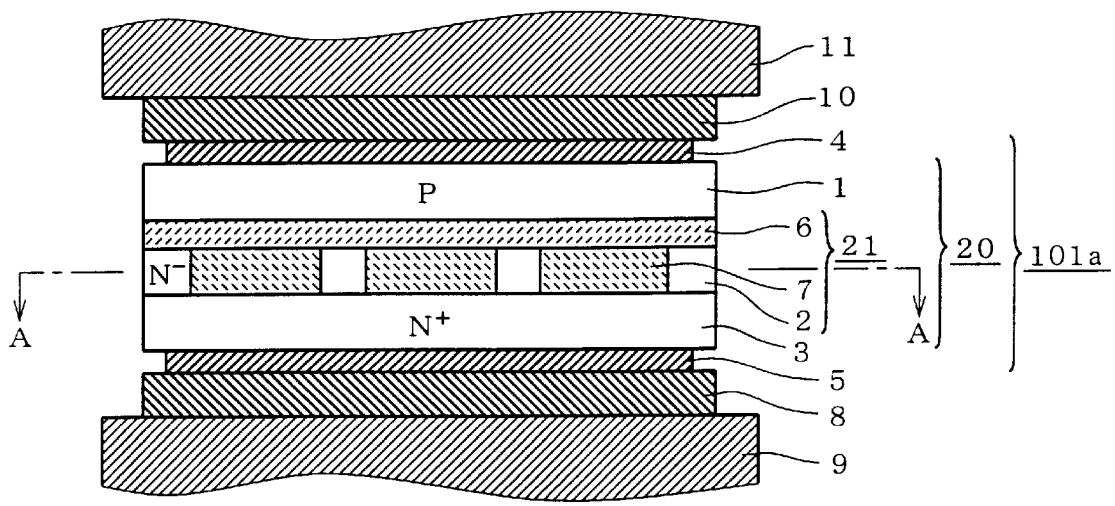
FIG. 7 is a sectional front view showing a variant of the first embodiment.
Figure 8:
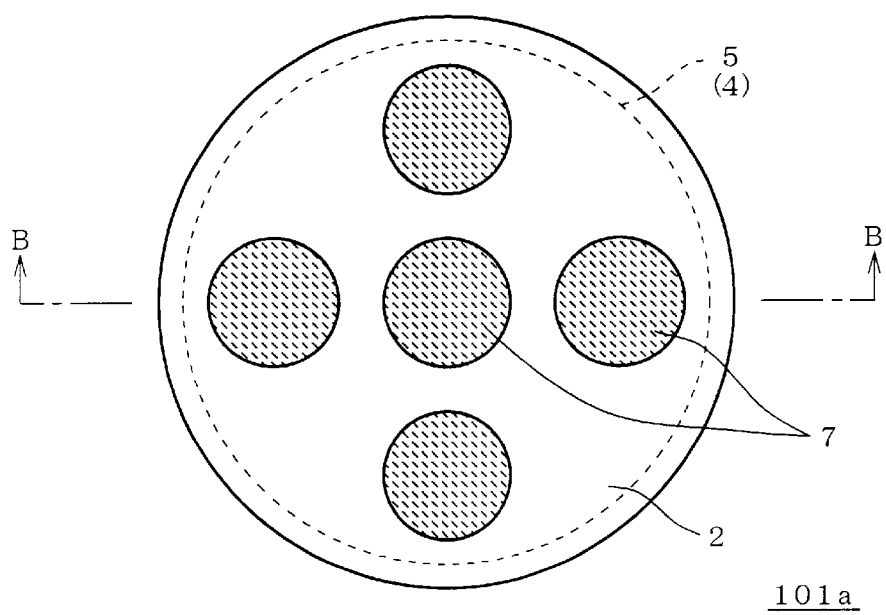
FIG. 8 is a sectional plan view showing the variant of the first embodiment.
Figure 9:
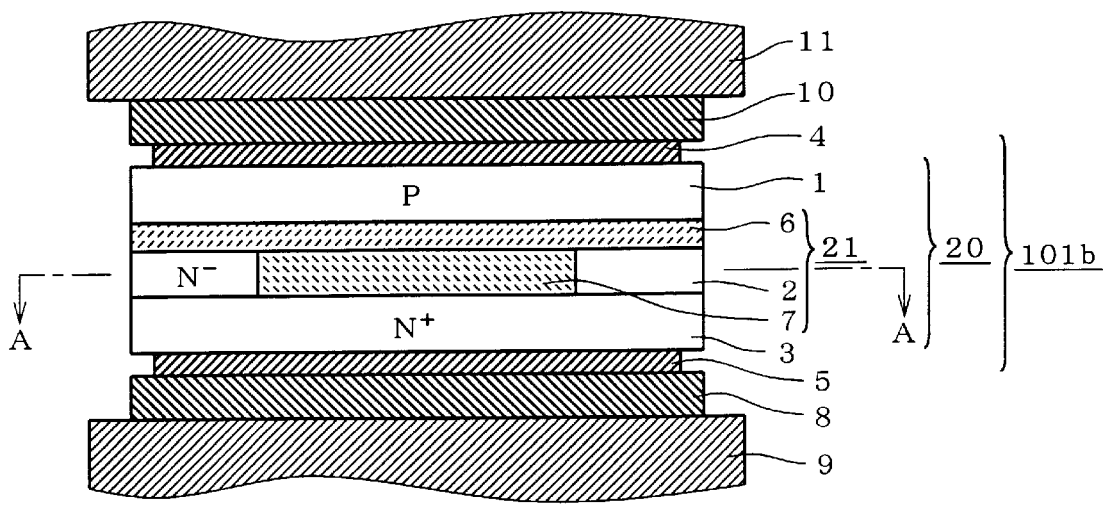
FIG. 9 is a sectional front view showing another variant of the first embodiment.
Figure 10:
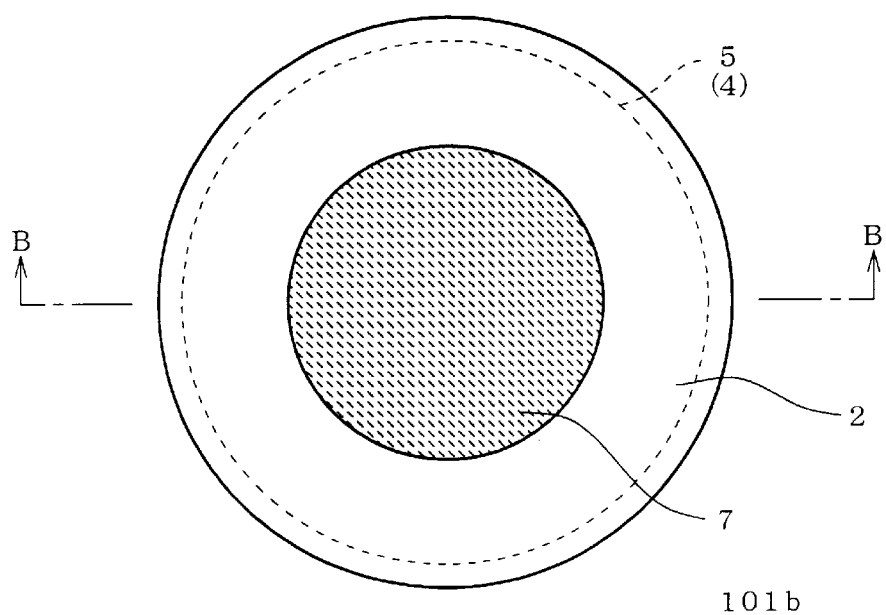
FIG. 10 is a sectional plan view showing another variant of the first embodiment.

In a diode element 101a shown in FIGS. 7 and 8, the second region 7 is divided into a plurality of (five in the drawings) unit regions having circular planar shapes respectively, and is provided symmetrically with respect to the center of the semiconductor substrate 20. In a diode element 101b shown in FIGS. 9 and 10, the second region 7 has a circular planar shape, and the planar shape of the third region 2 is defined annularly to surround the second region 7. More specifically, the second region 7 and the third region 2 are arranged just reversely to those of the diode element 101 shown in FIGS. 1 and 2.

Figure 11:
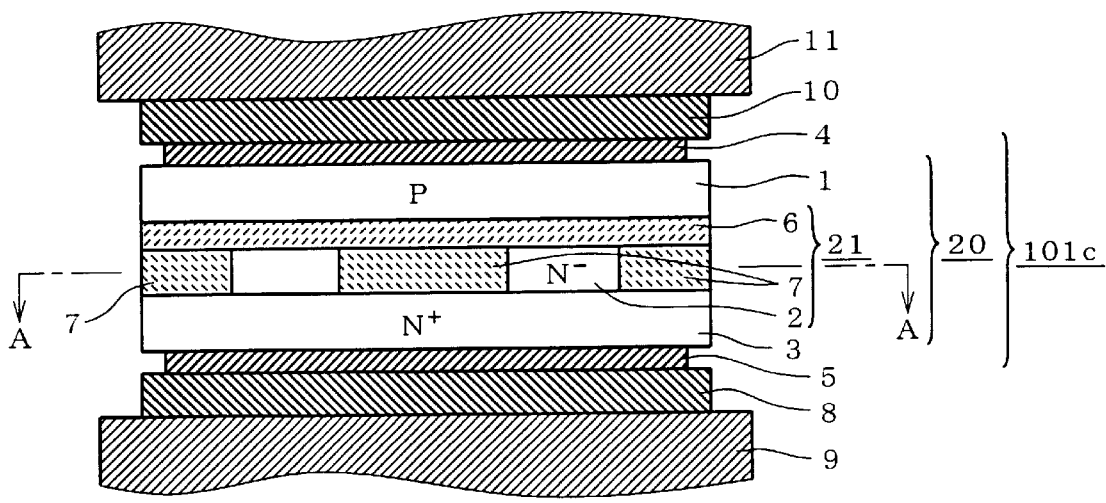
FIG. 11 is a sectional front view showing yet another variant of the first embodiment.
Figure 12:
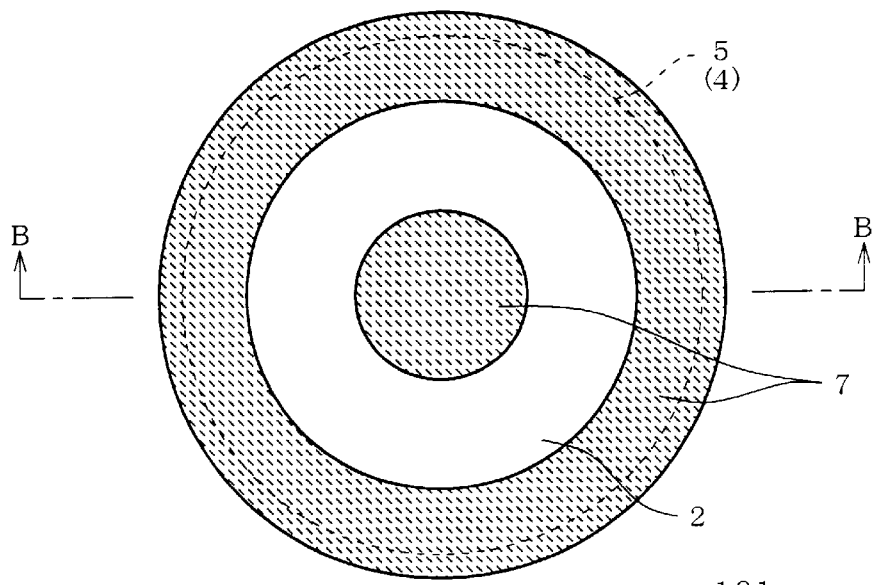
FIG. 12 is a sectional plan view showing yet another variant of the first embodiment.
Figure 13:
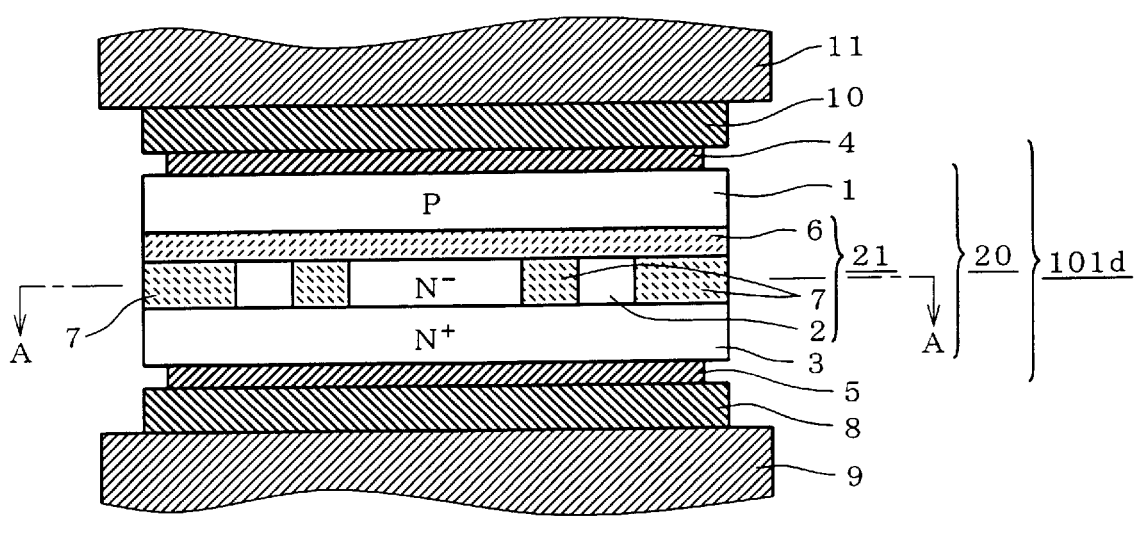
FIG. 13 is a sectional front view showing a further variant of the first embodiment.
Figure 14:
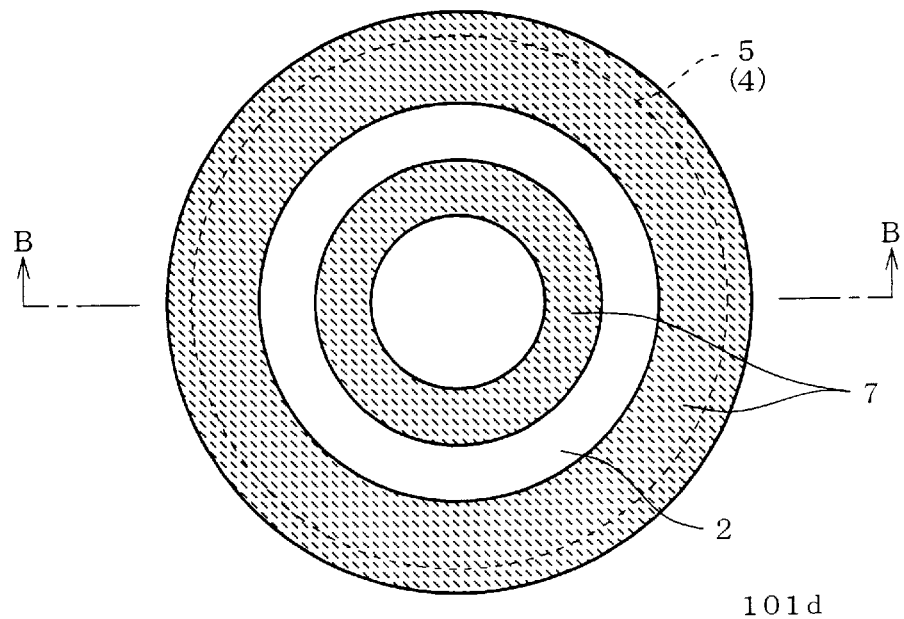
FIG. 14 is a sectional plan view showing the further variant of the first embodiment.

In a diode element 101c shown in FIGS. 11 and 12, the second region 7, the third region 2 and the second region 7 are sequentially provided from the center of a main surface toward the outside with a concentric circles as boundaries. In a diode element 101d shown in FIGS. 13 and 14, the third region 2, the second region 7, the third region 2 and the second region 7 are sequentially provided from the center of a main surface toward the outside with concentric circles as boundaries.

The diode elements 101 and 101b to 101d are common in that the second region 7 and the third region 2 are alternately provided sequentially from the center of the main surface toward the outside with the concentric circles as boundaries. Furthermore, they are also common in that a distribution of a heat loss caused by a forward current and a reverse current is not biased and the heat loss is effectively dispersed from the diode element to the post electrodes 11 and 9 and the like provided on the outside thereof.

As the second region 7 or the first region 6 is divided into more regions, the heat loss is dispersed more effectively. In other words, the uniformity of the heat loss is enhanced still more. Accordingly, the diode element 101d is more excellent in the uniformity of the heat loss than the diode element 101, for example. Although the diode element 101a is inferior to the diode element 101 and the like in respect of symmetry with respect to the center of the main surface, it is still excellent in the uniformity of the heat loss because the second region 7 is divided.

<2. Second Embodiment>

Next, a diode according to a second embodiment will be described.

<2-1. Structure of Device>

Figure 15:
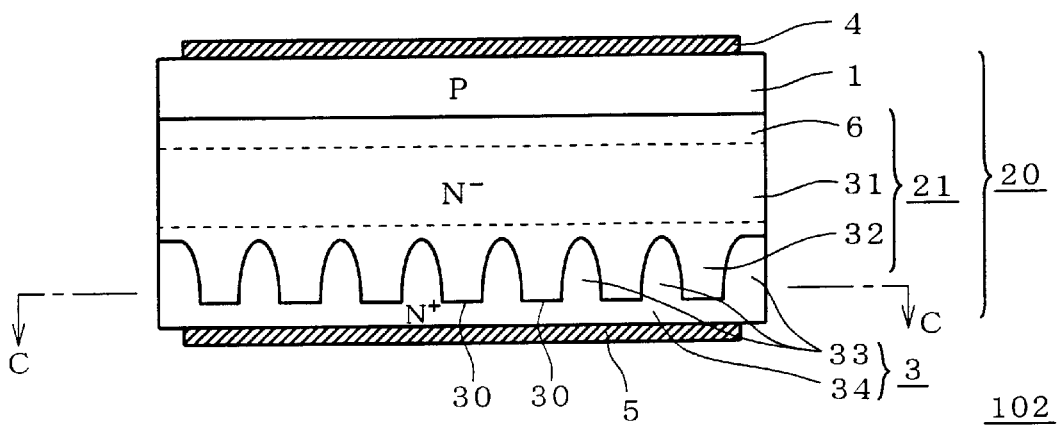
FIG. 15 is a sectional front view showing a diode according to a second embodiment.
Figure 16:
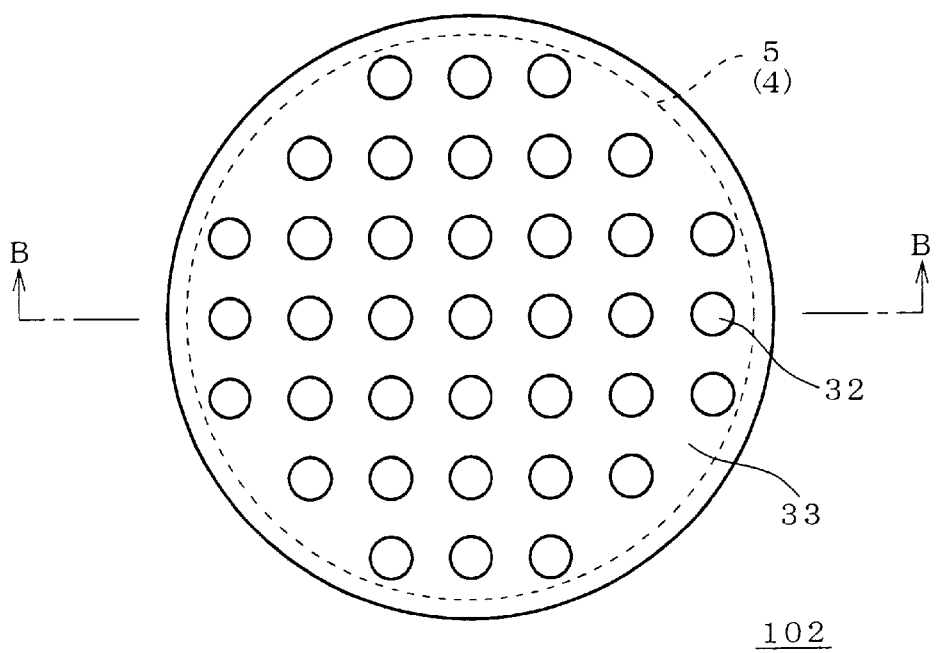
FIG. 16 is a sectional plan view showing the diode according to the second embodiment.

FIGS. 15 and 16 are a sectional front view and a sectional plan view which show a diode element forming a main part of the diode according to the second embodiment, respectively. A cut surface of FIG. 15 is taken along the line B—B in FIG. 16, and a cut surface of FIG. 16 is taken along the line C—C in FIG. 15. In the same manner as the diode element 101, a diode element 102 comprises a semiconductor substrate 20, an anode electrode 4 and a cathode electrode 5.

The semiconductor substrate 20 has a P layer 1, an N⁻ layer 21 and an N⁺layer 3 sequentially provided from an upper main surface toward a lower main surface. Differently from the diode element 101, however, a boundary interface between the N⁻ layer 21 and the N⁺layer 3 is not a plane but has concave and convex portions. More specifically, the boundary interface between the N⁺layer 3 and the N⁻ layer 21 retreats toward the N⁺layer 3 side (that is, in a direction of the lower main surface of the semiconductor substrate 20) in a plurality of portions 30.

Accordingly, the N⁺layer 3 includes thick portions 33 and thin portions 34. Conversely, the N⁻ layer 21 is protruded in portions which are in contact with the thin portions 34, and retreats in portions which are in contact with the thick portions 33. The planar shape of the thin portion 34, that is, a shape projected on the main surface of the semiconductor substrate 20 is desirably circular as shown in FIG. 16. Moreover, it is desirable that the thin portions 34 should be set to have the same planar shapes and be arranged at regular intervals to be uniformly distributed along the lower main surface of the semiconductor substrate 20 as shown in FIG. 16.

Also in the diode element 102, life time killers are selectively introduced into the semiconductor substrate 20, thereby controlling a life time of carriers. As a result, three regions having different life times, that is, a first region 6, a second region 31 and a third region 32 are defined in the N⁻ layer 21.

The first region 6 occupies a region of the N⁻ layer 21 in the vicinity of a PN junction in the same manner as the first region 6 according to the first embodiment. More specifically, the first region 6 faces the PN junction in the N⁻ layer 21 between the N⁻ layer 21 and the P layer 1 and is defined as a layered region apart from the N⁺layer 3.

The second region 31 is defined as a region adjacent to the opposite side of a PN junction interface of the first region 6. Furthermore, the third region 32 is adjacent to the opposite side of a boundary interface between the second region 31 and the first region 6, and is furthermore in contact with the N⁺layer 3. In other words, the first region 6, the second region 31 and the third region 32 are provided integrally with each other in this order from the PN junction interface with the P layer 1 toward the boundary interface with the N⁺layer 3.

In examples shown in FIGS. 15 and 16, a boundary interface between the second region 31 and the third region 32 is positioned apart from a tip of the thick portion 33 toward the P layer 1. Accordingly, only the third region 32 comes in contact with the N⁺layer 3 among the three regions 6, 31 and 32.

Figure 17:
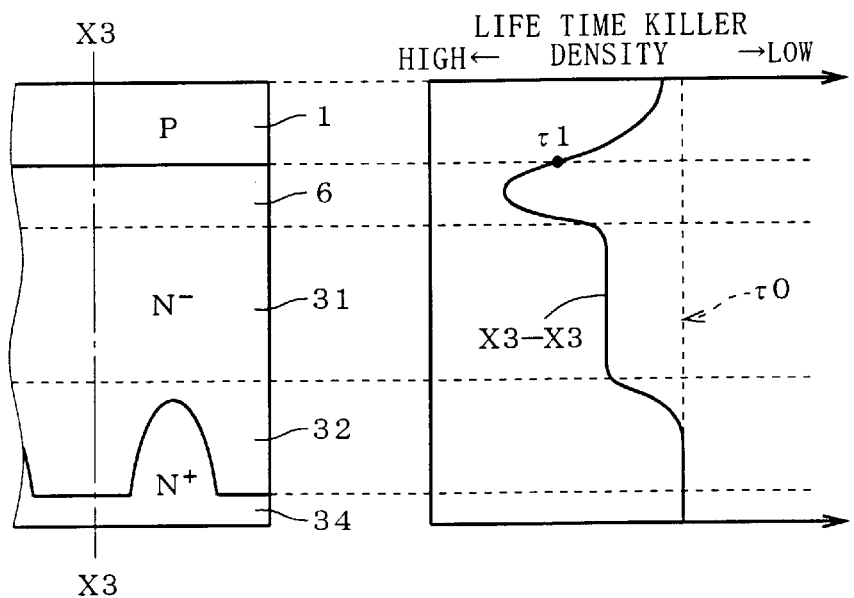
FIG. 17 is a graph showing a profile of a life time killer density according to the second embodiment.

FIG. 17 is a graph showing a profile of a density of the life time killers introduced into the semiconductor substrate 20. In the graph, a profile taken along the vertical line X3—X3 through the thin portion 34 is depicted. The density of the life time killers is selectively high in the first region 6 including the PN junction interface. The reason why the density in the P layer 1 is also high has been described in the first embodiment.

The life time killers are also introduced into the second region 31. The density of the life time killers in the second region 31 is set lower than in the first region 6. The life time killers are not substantially introduced into the third region 32. As described above, the profile of the life time in the N⁻ layer 21 corresponds to that of the density of the life time killers. Accordingly, a relationship of the life time among the three regions in the N⁻ layer 21 is given by the following Equation 2.

(First region 6)<(Second region 31)<(Third region 32)(Equation 2)

In the substantial portion of the third region 32 where the life time killers are not introduced, an original life time τ0 of the N⁻ layer 21 is implemented. On the other hand, a life time in the first region 6 is set shorter than the life time τ0, and a life time τ1 on the PN junction interface is also set shorter than the life time τ0.

The life time killers can be selectively introduced by the same method as in the first embodiment. The distribution of the life time killers in a direction of the main surface of the semiconductor substrate 20 is uniform. Differently from the first embodiment, therefore, a mask pattern is not required.

In particular, it is desirable that a local life time control technique should be applied to the introduction of the life time killers into the second region 31. In this technique, charged particles such as accelerated light ions are irradiated on the semiconductor substrate 20. As a result, the life time killers are locally introduced in the vicinity of a range of the charged particle which is determined by an accelerating energy.

<2-2. Operation of Device>

Figure 18:
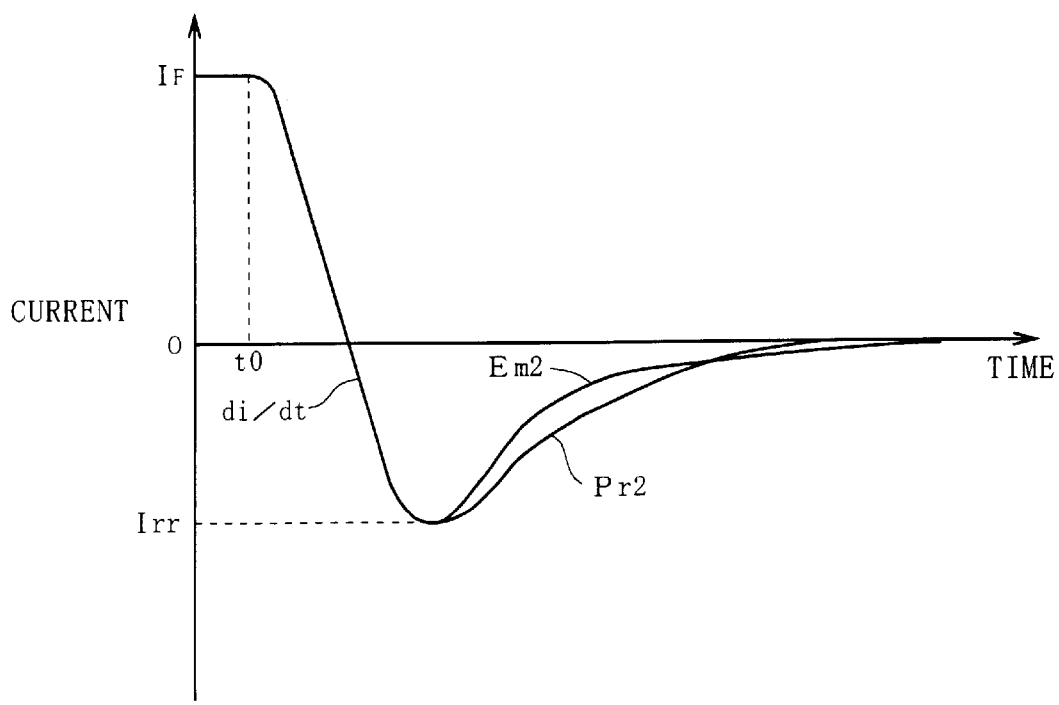
FIG. 18 is a graph showing a reverse recovery operation according to the second embodiment.

FIG. 18 is a graph showing a reverse recovery operation of the diode according to the second embodiment illustrated in FIGS. 15 to 17. In the graph, a curve Em2 represents a current waveform of the diode according to the second embodiment. For comparison, the curve Pr2 related to the diode according to the conventional example 2 is also depicted. Since a waveform of a reverse voltage v of the diode is almost the same as in the first embodiment, it is omitted.

In the diode according to the second embodiment, the life time of the carriers in each of the first region 6 and the second region 31 is set short. Therefore, a reverse recovery characteristic has the following features. Since the life time is set short in the first region 6, a reverse recovery current $I_{rr}$ is reduced in the same manner as in the conventional example 2. Furthermore, the second region 31 having a life time set short is provided. Therefore, the recombination of residual carriers is promoted also in the process in which a depletion layer is enlarged beyond the first region 6.

For this reason, the attenuation of the reverse recovery current is more promoted as shown in the curve Em2 of FIG. 18 than in the conventional example 2 (curve Pr2). As a result, a reverse recovery loss is more reduced than in the conventional example 2. Differently from the first embodiment, a reverse current does not concentrate in a part of the regions. Therefore, if the conditions of the first region 6 are the same as in the conventional example 2, the reverse recovery current $I_{rr}$ does not exceed the reverse recovery current $I_{rr}$ in the conventional example 2. Accordingly, a di/dt capability can have a high value in the same manner as in the conventional example 2.

Furthermore, the life time killers are not introduced into the third region 32 adjacent to the N⁺layer 3. Therefore, excess carriers are annihilated with difficulty in the third region 32. For this reason, the carriers are annihilated with difficulty at a stage in which the depletion layer approaches the N⁺layer 3, that is, the last stage of the reverse recovery operation. In particular, the thin portions 34 in the N⁺layer 3, that is, portions of the boundary interface between the N+layer 3 and the third region 32 which retreat toward the lower main surface of the semiconductor substrate 20 are present. By making a comparison on the condition that the semiconductor substrate 20 has the same thickness, therefore, a capacitance C equivalently formed on the semiconductor substrate 20 keeps a finite value for a longer period of time.

As a result, the capacitance C is larger than the capacitance C (Pr2) of the conventional example 2 at the last stage of the reverse recovery operation and keeps a finite value for a longer period of time in the same manner as the capacitance C (Em1) shown in FIG. 5. Also at the last stage of the reverse recovery operation, accordingly, oscillation is suppressed, and a reverse voltage smoothly converges on a steady value without great oscillation in the same manner as the curve v (Em1) shown in FIG. 4.

It is desirable that the semiconductor substrate 20 should be as thin as possible in order to reduce a forward voltage. In the diode according to the second embodiment, it is possible to effectively suppress the oscillation without increasing the thickness of the semiconductor substrate 20, that is, without sacrificing the forward voltage.

If the N+layer 3 becomes thin all over, a leak current in a steady state which is obtained after the reverse recovery operation is increased. In the diode according to the second embodiment, the N+layer 3 is partially thin. Therefore, the oscillation can effectively be suppressed without increasing the leak current. This fact has also been confirmed by a simulation as will be described below.

Figure 19:
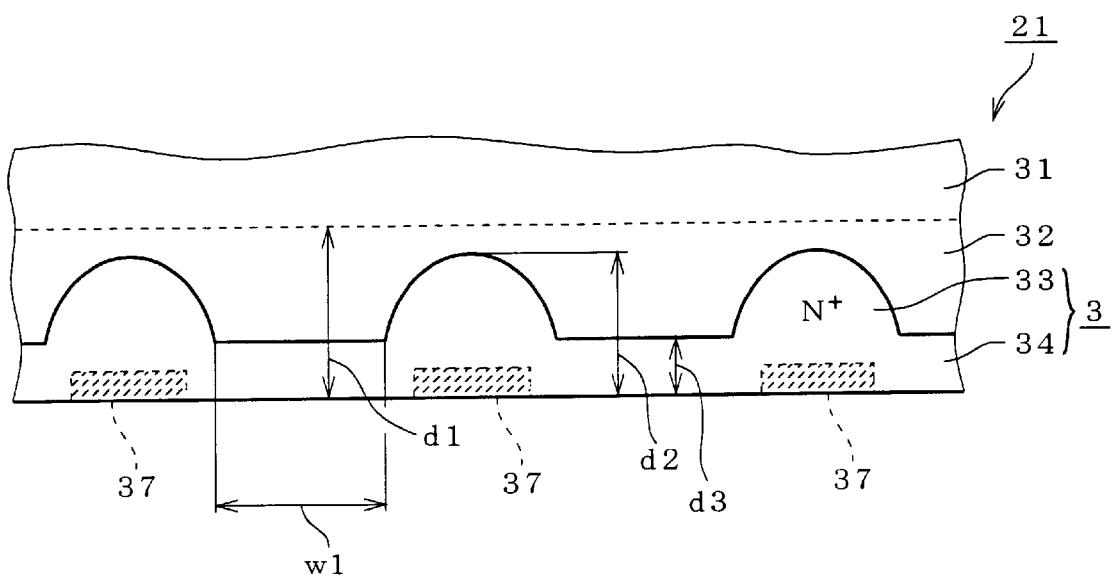
FIG. 19 is a partially enlarged sectional view showing the diode according to the second embodiment.
Figure 20:
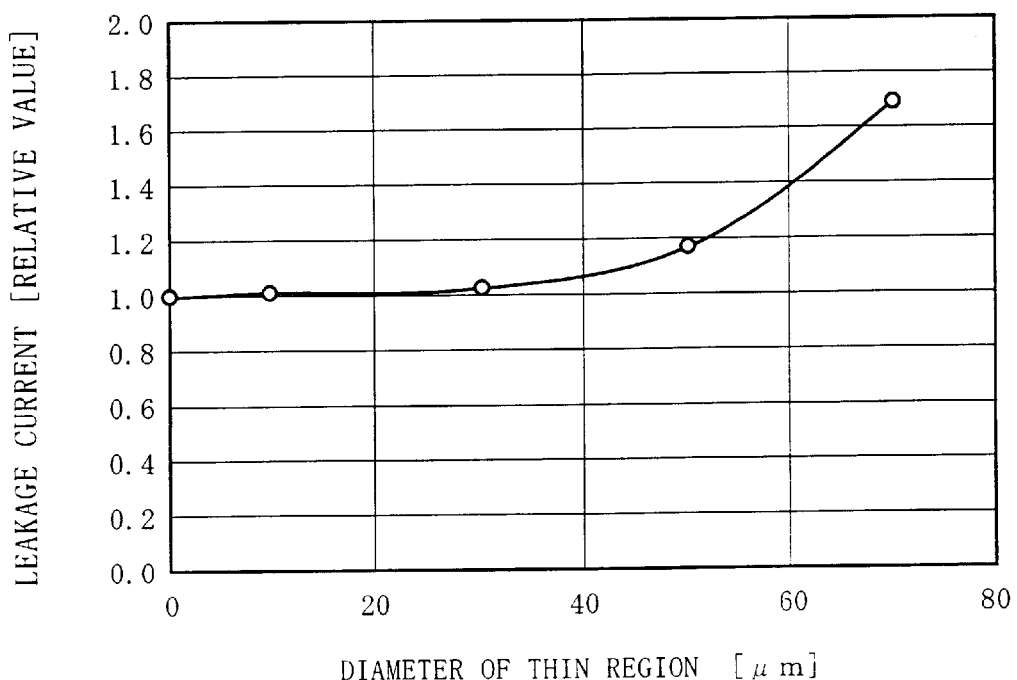
FIG. 20 is a graph showing a result of a simulation according to the second embodiment.

FIG. 19 is a partially enlarged sectional view showing the N+layer 3 and the vicinity thereof which are enlarged. The planar shape of the thin portion 34 is circular as described above, and has a diameter represented by w1. FIG. 20 is a graph showing data obtained based on a simulation for a relationship between the diameter w1 and a leak current (leakage current) in a steady state.

As shown in the graph, the leak current is almost constant with the diameter w1 ranging from 0 to 50 $\mu$m, and is rarely affected by the existence of the thin portion 34. On the other hand, if the diameter w1 exceeds about 50 $\mu$m, the leak current is rapidly increased. Accordingly, it is desirable that the diameter w1 of the thin portion 34 should be set to 50 $\mu$m or less in order not to increase the leak current. In the case where the planar shape of the thin portion 34 is not circular, the increase in the leak current can similarly be prevented if a maximum diameter is set to 50 $\mu$m or less.

Figure 21:
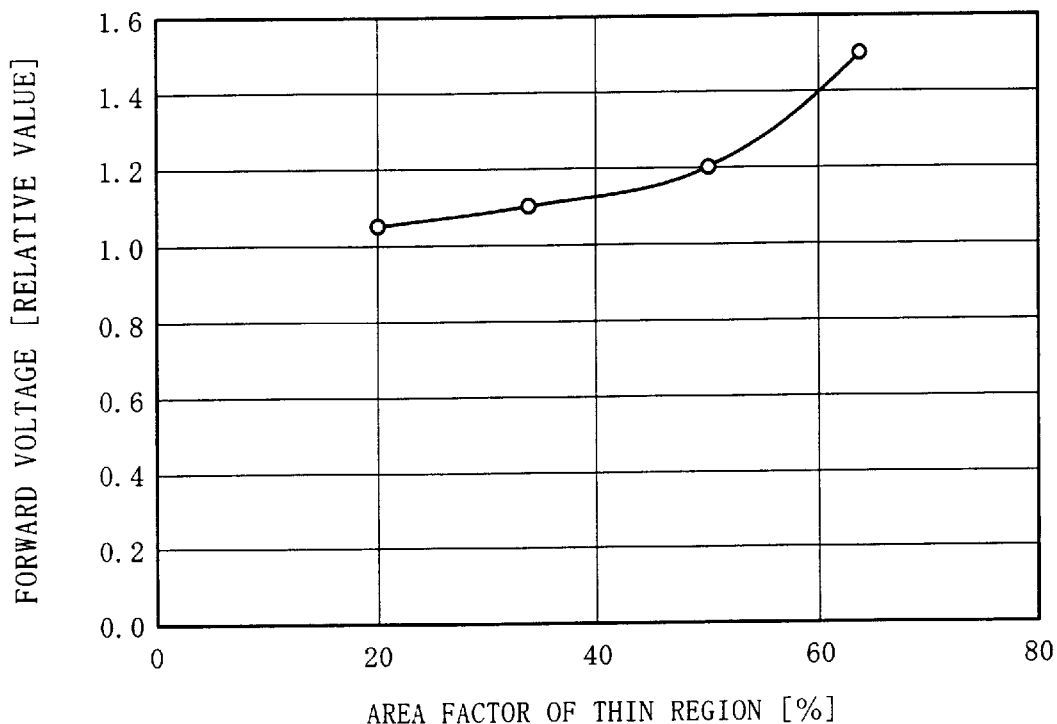
FIG. 21 is a graph showing a result of a simulation according to the second embodiment.

If the thin portions 34 in the N+layer 3 amount to a large ratio, the forward voltage is affected. FIG. 21 is a graph showing data obtained by confirming this fact based on a simulation. An area factor of the thin portions 34 means a ratio of an area occupied by a region where the thin portions 34 are projected to the lower main surface of the semiconductor substrate 20.

As shown by the graph, the forward voltage is rarely affected by the thin portions 34 with the area factor of the thin portions 34 ranging from 0 to 50%. On the other hand, if the area factor exceeds 50%, the forward voltage is remarkably increased. Accordingly, it is desirable that the area factor of the thin portions 34 should be set to 50% or less in order not to increase the forward voltage.

In the diode according to the second embodiment, the life time is set short in the second region 31 as well as the first region 6. Therefore, a resistance for the forward current is increased a little more than in the conventional example 2. As a result, the forward voltage has a little higher value than in the conventional example 2 by the influence of the second region 31. However, it is not necessary to set the life time of the second region 31 shorter than in the first region 6. As long as the life time of the second region 31 is not set excessively short, the forward voltage can have a value which approximates to the value in the conventional example 2.

As described above, in the diode according to the second embodiment, it is possible to simultaneously implement a high di/dt capability, a low reverse recovery loss and a comparatively low forward voltage. Furthermore, the voltage oscillation can be prevented in the process of the reverse recovery operation.

<2-3. More Optimum Condition of N+layer 3>

Returning to FIG. 19, more desirable conditions for the shape of the N+layer 3 will be described below. The N− layer 21 is thinner in the vicinity of the thick portions 33 than the vicinity of the thin portions 34, and a resistance component of the N− layer 21 is correspondingly reduced. Accordingly, when the forward current flows, a current density is more increased in the thick portions 33 than in the thin portions 34. When a transition to the reverse recovery operation is started in this state, the reverse current also concentrates more easily in the thick portions 33 than in the thin portions 34.

As illustrated in FIG. 16, the thin portions 34 have the same planar shapes and are arranged at regular intervals uniformly distributed along the lower main surface of the semiconductor substrate 20. Consequently, the concentration of the reverse current can be relieved. Thus, it is possible to prevent a reduction in a blocking capability from being caused by an increase in a local loss.

As described above, the boundary interface between the second region 31 and the third region 32 is positioned apart from the tips of the thick portions 33 toward the P layer 1. More specifically, a space dl between the boundary interface of the second region 31 and the third region 32 and the lower main surface of the semiconductor substrate 20 is set larger than a thickness d2 of the thick portions 33 as shown in FIG. 19. Consequently, the capacitance C equivalently formed on the semiconductor substrate 20 keeps a finite value for a longer period of time in the last stage of the reverse recovery operation. Consequently, oscillation can be suppressed more effectively.

It is desirable that an impurity concentration of the N+layer 3 should be set to $1 \times 10^{18}$ n/cm$^3$ or more on an exposed surface 37 in the lower main surface of the semiconductor substrate 20 where the thick portions 33 are exposed. Consequently, a good ohmic contact can be implemented between the N+layer 3 and the cathode electrode 5. Furthermore, it is also possible to employ a simple manufacturing method in which the thick portions 33 and the thin portions 34 are formed simply by selectively introducing an N type impurities into only the exposed surface 37 in the lower main surface of the semiconductor substrate 20 and then diffusing the same N type impurities when forming the N+layer 3.

Figure 22:
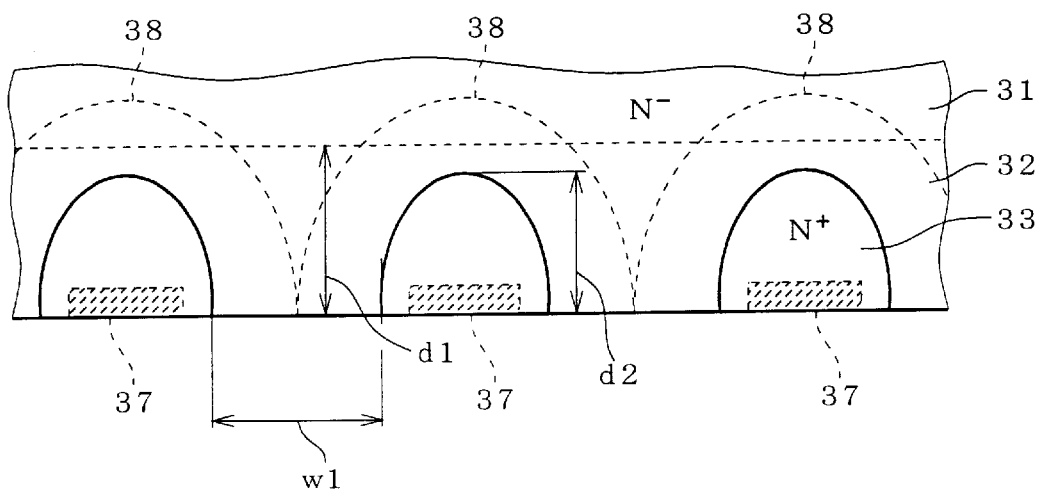
FIG. 22 is a partially enlarged sectional view showing a variant of the second embodiment.

There is a possibility that the leak current might be increased if a thickness d3 of the thin portions 34 is set excessively small. However, when the diameter w1 is set to 50 $\mu$m or less and a surface concentration of the impurities on the exposed surface 37 is set to $1 \times 10^{18}$ n/cm$^3$ or more, the thickness d3 can also be set to 5 $\mu$m or less, for example, without increasing the leak current. In particular, the thickness d3 can also be set to 0 as shown in FIG. 22.

The reason is that carriers are diffused from the thick portion 33 having a high impurity concentration toward a periphery 38 and the thin portions 34 are covered with the diffused carriers, thereby exhibiting a fully high voltage holding capability. By setting the thickness d3 to 0, it is possible to bring out the effect of suppressing the oscillation at the maximum without increasing the thickness of the semiconductor substrate 20. It is desirable that the thickness d2 of the thick portion 33 should be set to 50 μm or more.

<2-4. Variant Related to Thickness of Third Region 32>

Figure 23:
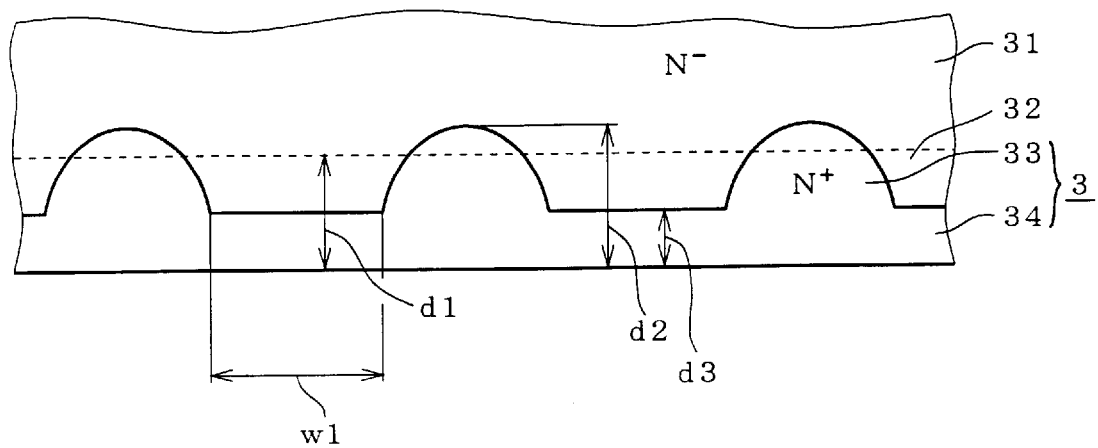
FIG. 23 is a partially enlarged sectional view showing another variant of the second embodiment.
Figure 24:
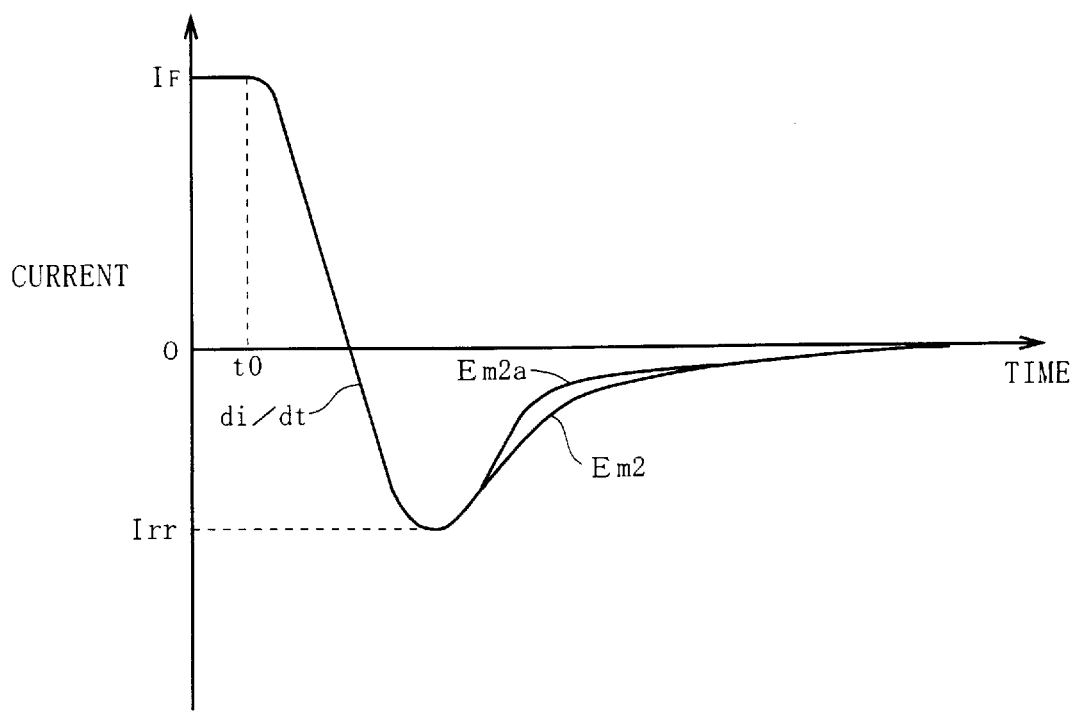
FIG. 24 is a graph showing a reverse recovery operation according to anothe r variant of the second embodiment.

FIG. 23 is a partially enlarged sectional view showing a variant related to the thickness of the third region 32. As shown, it is also possible to set the space d1 smaller than the thickness d2 in such a manner that a part of the second region 31 comes in contact with the thick portions 33. In this example, the second region 31 has a greater thickness than in the example of FIG. 19. Therefore, the reverse recovery current is attenuated more quickly as shown in a curve Em2a of FIG. 24 so that a reverse recovery loss can be reduced still more.

However, the third region 32 has a larger thickness in the example illustrated in FIG. 19. Therefore, the effect of suppressing oscillation is more excellent in the example of FIG. 19. It is possible to widely select the space dl depending on intended use.

<3. Third Embodiment>

Next, a diode according to a third embodiment will be described.

<3-1. Structure of Device>

Figure 25:
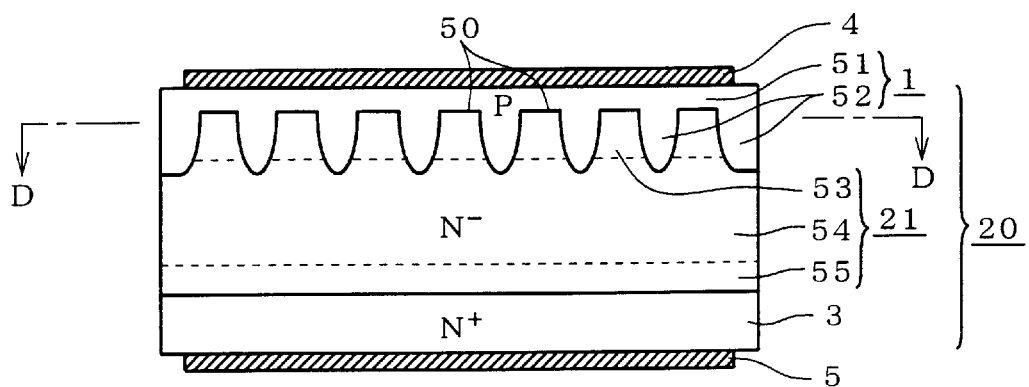
FIG. 25 is a sectional front view showing a diode according to a third embodiment.
Figure 26:
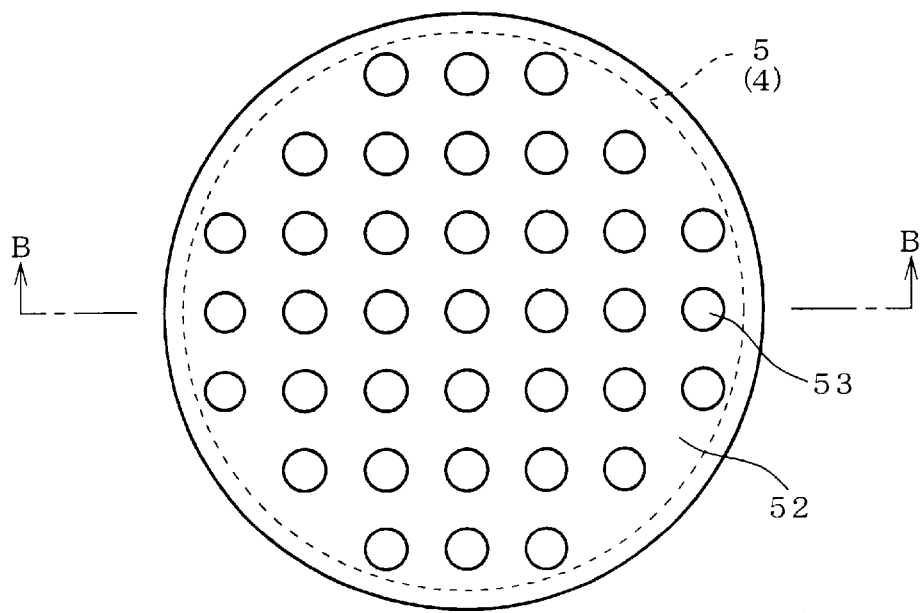
FIG. 26 is a sectional plan view showing the diode according to the third embodiment.

FIGS. 25 and 26 are a sectional front view and a sectional plan view which show a diode element forming a main part of the diode according to the third embodiment, respectively. A cut surface of FIG. 25 is taken along the line B—B in FIG. 26, and a cut surface of FIG. 26 is taken along the line D—D in FIG. 25. A structure of a diode element 103 according to the present embodiment is just similar to a structure obtained by keeping the profile of the life time killers in its entirety and replacing the shapes of the P layer 1 and the N⁺layer 3 with each other in the diode element 102 as will be described below.

In the same manner as the diode elements 101 and 102, the diode element 103 also comprises a semiconductor substrate 20, an anode electrode 4 and a cathode electrode 5. Moreover, the semiconductor substrate 20 has a P layer 1, an N⁻ layer 21 and an N⁺ layer 3 sequentially provided from an upper main surface toward a lower main surface. Differently from the diode element 101, however, a PN junction interface between the P layer 1 and the N⁻ layer 21 is not a plane but has concave and convex portions. More specifically, a PN junction interface retreats toward the P layer 1 side (that is, in a direction of the upper main surface of the semiconductor substrate 20) in a plurality of portions 50.

In addition, the P layer 1 includes thin portions 51 and thick portions 52. Conversely, the N⁻ layer 21 is protruded in portions which are contact with the thin portions 51, and retreats in portions which are in contact with the thick portions 52. The planar shape of the thin portion 51, that is, a shape projected on the main surface of the semiconductor substrate 20 is desirably circular as shown in FIG. 26. Moreover, it is desirable that the thin portions 51 should be set to have the same planar shapes and be arranged at regular intervals to be uniformly distributed along the upper main surface of the semiconductor substrate 20 as shown in FIG. 26.

Also in the diode element 103, a life time killers are selectively introduced into three regions having different life times, that is, a first region 53, a second region 54 and a third region 55 are defined in the N⁻ layer 21.

The first region 53 occupies a region of the N⁻ layer 21 in the vicinity of a PN junction in the same manner as the first region 6 according to the first and second embodiments.

More specifically, the first region 53 faces the PN junction in the N⁻layer 21 between the N⁻ layer 21 and the P layer 1 and is defined as a layered region apart from the N⁺layer 3.

The second region 54 is defined as a region adjacent to the opposite side of a PN junction interface of the first region 53. Furthermore, the third region 55 is adjacent to the opposite side of a boundary interface between the second region 54 and the first region 53, and is furthermore in contact with the N⁺layer 3. In other words, the first region 53, the second region 54 and the third region 55 are provided integrally with each other in this order from the PN junction interface with the P layer 1 toward a boundary interface with the N⁺layer 3.

In examples shown in FIGS. 25 and 26, the boundary interface between the first region 53 and the second region 54 is positioned not apart from tips of the thick portions 52 toward the N⁺layer 3. Accordingly, both the first region 53 and the second region 54 come in contact with the P layer 1, thereby forming a PN junction interface.

Figure 27:
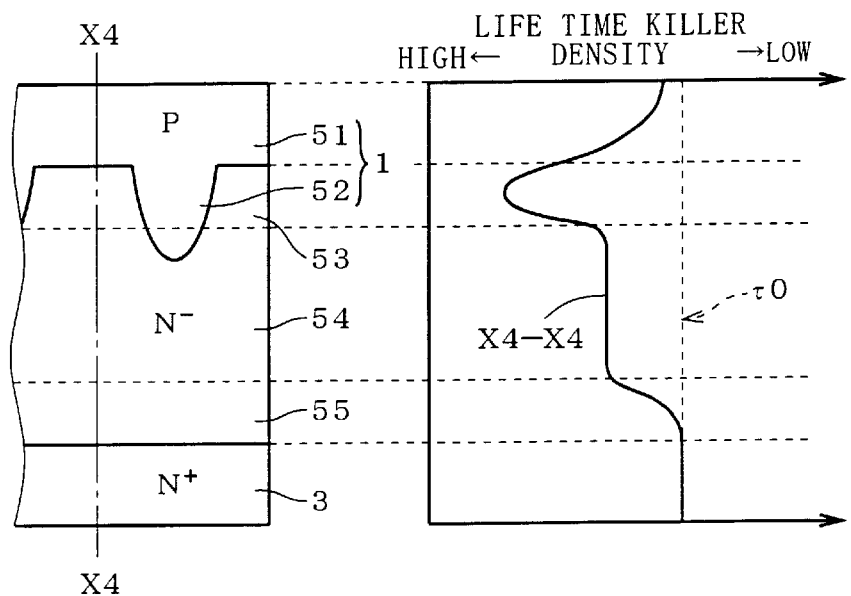
FIG. 27 is a graph showing a profile of a life time killer density according to the third embodiment.

FIG. 27 is a graph showing a profile of a density of the life time killers introduced into the semiconductor substrate 20. In the graph, a profile taken along the vertical line X4—X4 through the thin portion 51 is depicted. The density of the life time killers is selectively high in the first region 53 including the PN junction interface. The reason why the density in the P layer 1 is also high has been described in the first embodiment.

The life time killers are also introduced into the second region 54. The density of the life time killers in the second region 54 is set lower than in the first region 53. The life time killers are not substantially introduced into the third region 55. Accordingly, a relationship of the life time among the three regions in the N⁻ layer 21 is given by the following Equation 3.

$$\text{(First region 53)} < \text{(Second region 54)} < \text{(Third region 55)} \quad \text{(Equation 3)}$$

In the substantial portion of the third region 55 where the life time killers are not introduced, an original life time τ0 of the N⁻ layer 21 is implemented. On the other hand, a life time in the first region 53 is set shorter than the life time τ0, and a life time on the PN junction interface is also set shorter than the life time τ0. The life time killers can be selectively introduced by the same method as in the second embodiment.

<3-2. Operation of Device>

Figure 28:
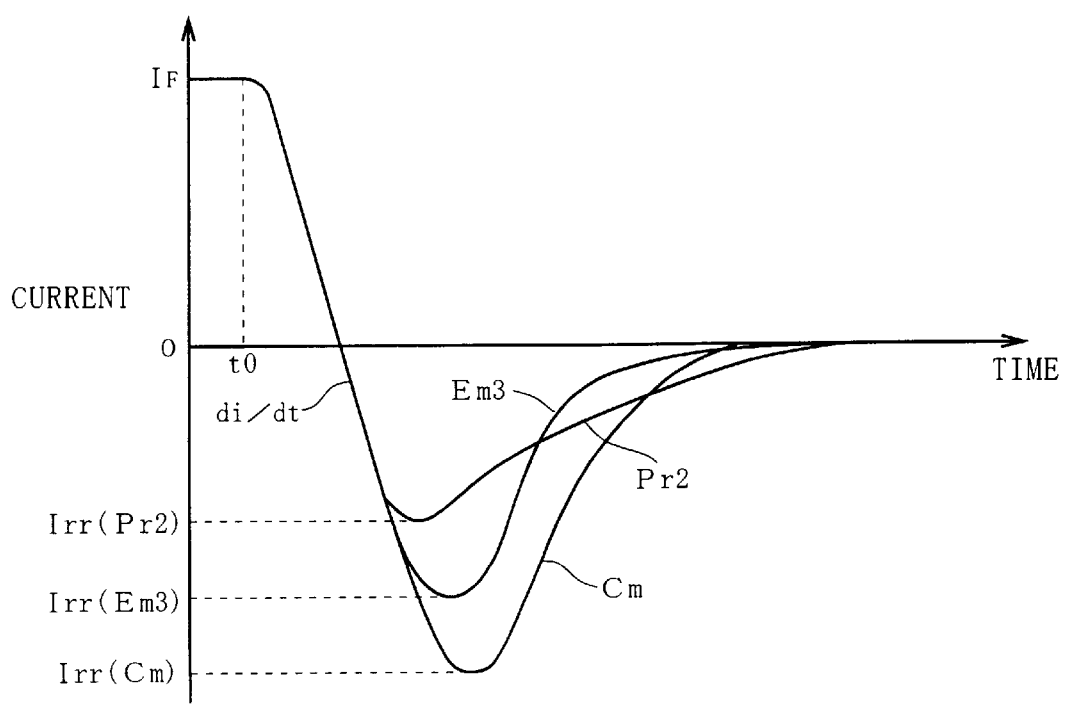
FIG. 28 is a graph showing a reverse recovery operation according to the third embodiment.

FIG. 28 is a graph showing a reverse recovery operation of the diode according to the third embodiment illustrated in FIGS. 25 to 27. In the graph, a curve Em3 represents a current waveform of the diode according to the third embodiment. For comparison, the curve Pr2 related to the diode according to the conventional example 2 is also depicted.

In the diode according to the third embodiment, the PN junction interface is provided with concave and convex portions. Therefore, an area of the PN junction interface is increased. For this reason, a large quantity of carriers are injected into the N⁻ layer 21. As a result, it is possible to obtain an advantage that a forward voltage can be reduced. On the other hand, since the quantity of the carriers is large, the annihilation of residual carriers is delayed in the reverse recovery operation. Consequently, a reverse recovery current $I_{rr}$ is larger than in the conventional example 2.

However, if it is assumed that the diode can implement a low forward voltage by setting the PN junction interface between the P layer 1 and the N⁻ layer 21 in the conventional example 1 to have the same shape as in the third embodiment, a current waveform is represented by a curve Cm in FIG. 28. In the virtual diode, the reverse recovery current $I_{rr}$ is remarkably increased as shown in the curve Cm. As a result, a reverse recovery loss has a large value. More specifically, a forward characteristic can be improved but fewer advantages of a reverse recovery characteristic can be gained with the PN junction interface having the concave and convex portions.

On the other hand, in the diode according to the third embodiment, the PN junction interface is provided with the concave and convex portions and a life time is set short in the first region 53 adjacent to the PN junction interface so that the reverse recovery characteristic can be prevented from being deteriorated. As is apparent from a comparison between the curve Em3 and the curve Cm, the reverse recovery current $I_{rr}$ can be reduced. In the diode according to the third embodiment, thus, the PN junction interface is provided with the concave and convex portions so that disadvantages which are secondarily produced can be relieved or eliminated and the forward characteristic can be improved while suppressing the deterioration in the reverse recovery characteristic such as a di/dt capability.

Furthermore, since the second region 54 having a life time set short is provided, the recombination of the residual carriers can be promoted also in the process in which a depletion layer is enlarged beyond the first region 53. As a result, the attenuation of the reverse recovery current can be more promoted as shown in the curve Em3 than in the conventional example 2 (curve Pr2). Consequently, an increase in the reverse recovery current $I_{rr}$ is not exactly linked with an increase in the reverse recovery loss. In other words, the reverse recovery loss does not have a much larger value than in the conventional example 2.

As described above, in the diode according to the third embodiment, it is possible to implement a low forward voltage while preventing the di/dt capability and the reverse recovery loss from being increased.

3-3. Optimum Condition of PN Junction Interface>

Figure 29:
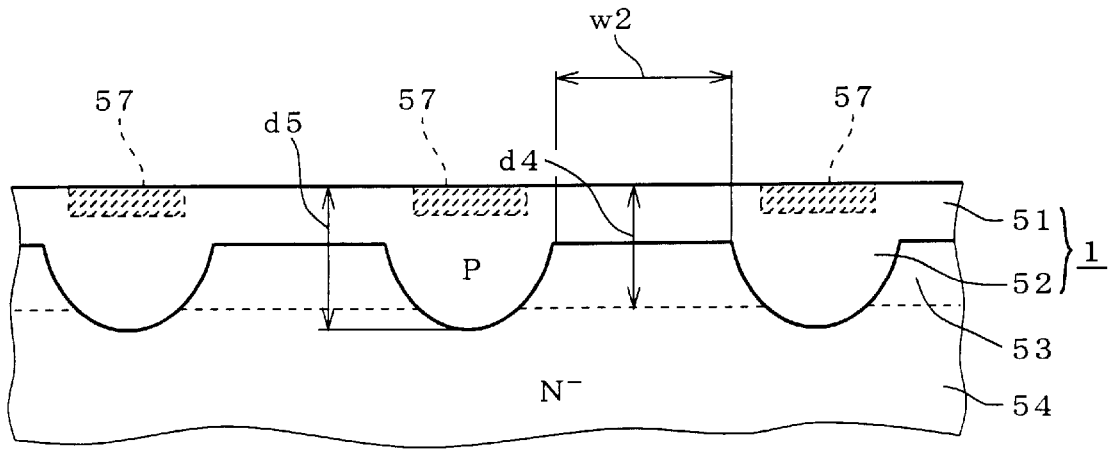
FIG. 29 is a partially enlarged sectional view showing the diode according to the third embodiment.

FIG. 29 is a partially enlarged sectional view showing the P layer 1 and the vicinity thereof which are enlarged. The planar shape of the thin portion 51 is circular as described above, and has a diameter represented by w2. In the vicinity of the thick portions 52, the N⁻ layer 21 is thinner than in the vicinity of the thin portions 51 so that a resistance component of the N⁻ layer 21 is correspondingly reduced. Accordingly, when a forward current flows, a current density is higher in the thick portions 52 than in the thin portions 51. When a transition to a reverse recovery operation is started in this state, a reverse current also concentrates more easily in the thick portions 52 than in the thin portions 51.

As illustrated in FIG. 26, the thin portions 51 have the same planar shapes and are arranged at regular intervals to be uniformly distributed along the upper main surface of the semiconductor substrate 20. Consequently, the concentration of the reverse current can be relieved. Thus, it is possible to prevent a reduction in a blocking capability from being caused by an increase in a local loss.

As described above, the boundary interface between the first region 53 and the second region 54 is positioned rearward apart from the tips of the thick portions 52 toward the upper main surface of the semiconductor substrate 20. More specifically, a space d4 between the boundary interface of the first region 53 and the second region 54 and the upper main surface of the semiconductor substrate 20 is set smaller than a thickness d5 of the thick portions 52 as shown in FIG. 29. For this reason, a forward voltage can be reduced effectively. Moreover, it is desirable that the thickness ds should be set to 50 µm or more. be set to 50 µm or more.

Figure 30:
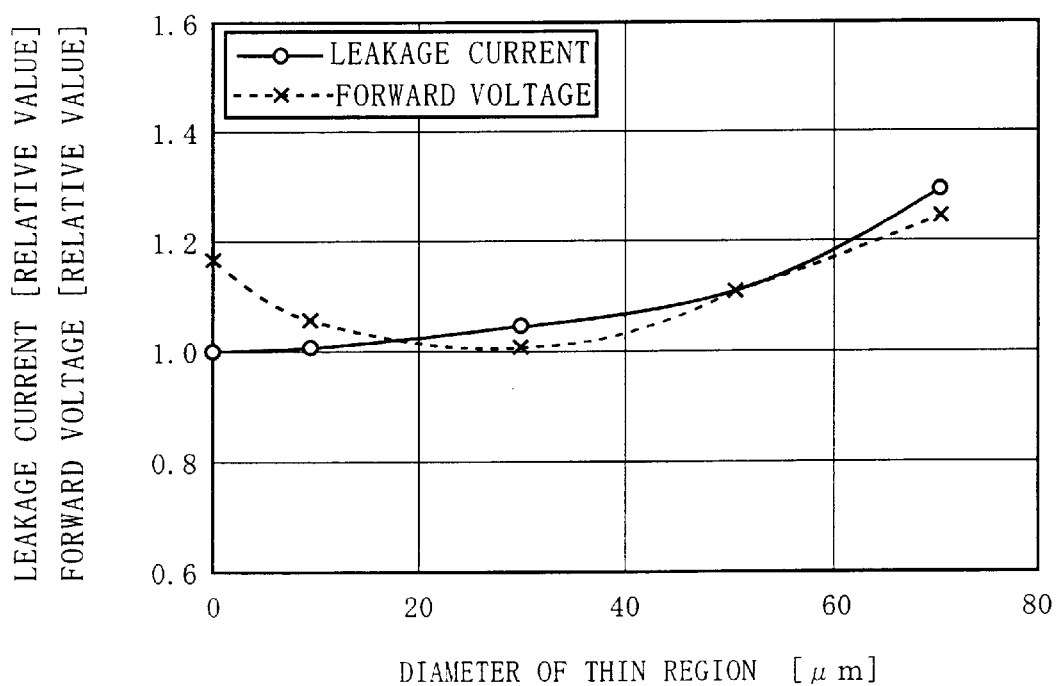
FIG. 30 is a graph showing a result of a simulation according to the third embodiment.

The planar shape of the thin portions 51 also affects a leak current (leakage current) and a forward voltage in a steady state. FIG. 30 is a graph showing data obtained based on a simulation for a relationship of the leak current and forward voltage to the diameter w2. As shown by the graph, the leak current is almost constant with the diameter w2 ranging from 0 to 50 µm and is rarely affected by the existence of the thin portion 51.

On the other hand, if the diameter w2 exceeds about 50 µm, the leak current is rapidly increased. Accordingly, it is desirable that the diameter w2 of the thin portion 51 should be set to 50 µm or less in order not to increase the leak current. When the planar shape of the thin portion 51 is not circular, the leak current can similarly be prevented from being increased if a maximum diameter is set to 50 µm or less.

When the diameter w2 is about 30 µm, the forward voltage has a minimum value. When the diameter w2 ranges from about 20 µm to about 40 µm, the forward voltage is rarely affected by a change in the diameter w2 but almost keeps the minimum value. Therefore, it is desirable that the diameter w2 should be set to about 20 µm to about 40 µm in consideration of both the forward voltage and the leak current.

Figure 31:
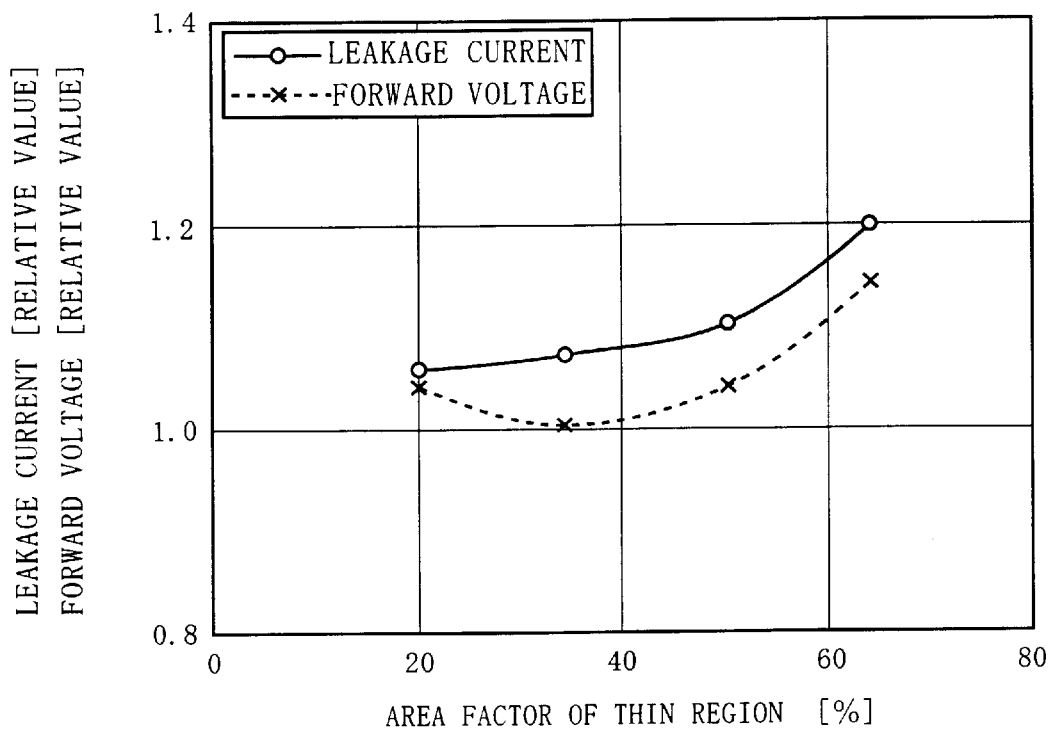
FIG. 31 is a graph showing a result of a simulation according to the third embodiment.

The ratio of the P layer 1 occupied by the thin portions 51 also affects the leak current and the forward voltage. FIG. 31 is a graph showing data obtained by confirming this fact based on a simulation. An area factor of the thin potions 51 means a ratio of an area occupied by a portion where the thin portions 51 are projected to the upper main surface of the semiconductor substrate 20.

As shown by the graph, the leak current is rarely affected by the thin portions 51 with the area factor of the thin portions 51 ranging from 0 to 50%. On the other hand, if the area factor exceeds 50%, the leak current is remarkably increased. 50% or less in order not to increase the leak current.

When the area factor of the thin portions 51 is about 35%, the forward voltage has a minimum value. When the area factor ranges from about 25% to about 45%, the forward voltage is rarely affected by a change in the area factor and almost keeps the minimum value. Accordingly, it is desirable that the area factor of the thin portions 51 should be set to about 25% to about 45% in consideration of both the forward voltage and the leak current.

Returning to FIG. 29, it is desirable that an impurity concentration in the P layer 1 should be set to $1 \times 10^{17}$ n/cm³ or more on an exposed surface 57 in the upper main surface of the semiconductor substrate 20 where the thick portions 52 are exposed. Consequently, a good ohmic contact can be realized between the P layer 1 and the anode electrode 4. Furthermore, it is also possible to employ a simple manufacturing method in which the thick portions 52 and the thin portions 51 are formed simply by selectively introducing a P type impurities into only the exposed surface 57 in the upper main surface of the semiconductor substrate 20 and then diffusing the same P type impurities when forming the P layer 1.

<3-4. Variant related to Thickness of First Region 53>

Figure 32:
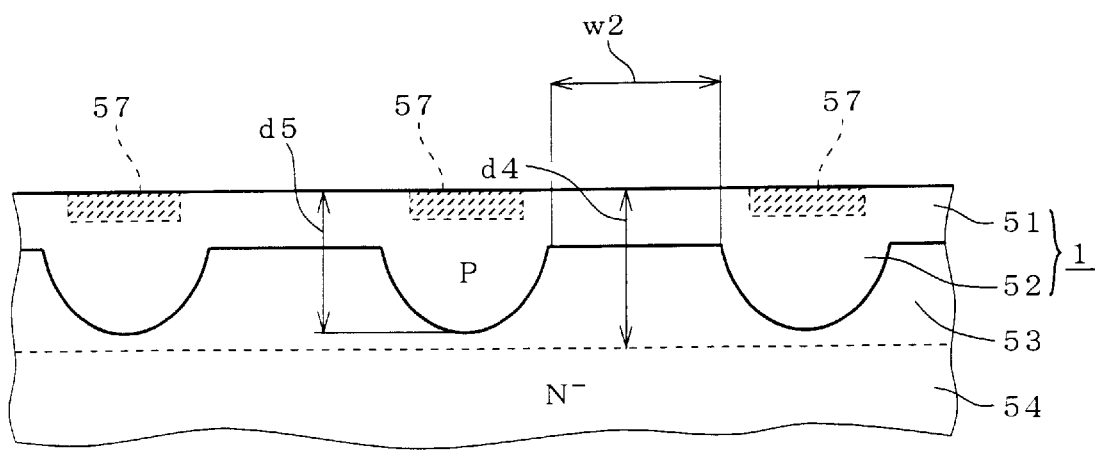
FIG. 32 is a partially enlarged sectional view showing a variant of the third embodiment.

The boundary interface between the second region 54 and the third region 55 may be positioned apart from the tips of the thick portion 52 toward the N⁺ layer 3. More specifically, the space d4 may be set larger than the thickness d5 of the thick portions 52 as shown in FIG. 32. As compared with the example of FIG. 29, consequently, the forward voltage is somewhat deteriorated but the reverse recovery current $I_{rr}$ can be reduced and the di/dt capability can be improved.

<4. Fourth Embodiment>

FIG. 33 collectively shows the quality of each of parameters for evaluating the

FIG. 33 collectively shows the quality of each of parameters for evaluating the characteristic of the diode in the form of a table according to each of the above-mentioned embodiments. For comparison, the quality of each of parameters according to the conventional examples 1 and 2 is also described. In FIG. 33, items in which preferred characteristics can be obtained are shown by hatching. Each of the above-mentioned embodiments can properly be carried out in combination with each other. Thereby a mean value for each parameter can be obtained. In other words, the degree of design freedom can be increased in consideration of the combination.

Figure 34:
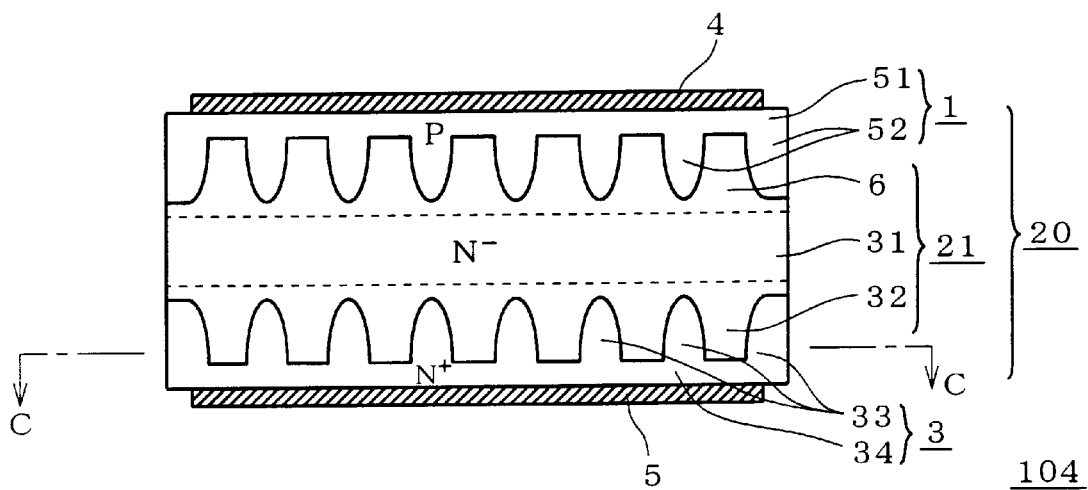
FIG. 34 is a sectional front view showing a diode according to a fourth embodiment.

For example, it is possible to constitute a diode element having both features of the diode elements 102 and 103 as shown in FIG. 34. In a diode element 104, a P layer 1 provided in a semiconductor substrate 20 is equivalent to the P layer 1 of the diode element 103. An N⁻ layer 21 and an N⁺ layer 3 are formed equivalently to corresponding semiconductor layers of the diode element 102, respectively.

More specifically, the P layer 1 includes a thin portions 51 and thick portions 52, and the N⁺ layer 3 also includes a thick portions 33 and thin portions 34. Furthermore, the N⁻ layer 21 has a first region 6, a second region 31 and a third region 32 formed thereon. A profile of a life time in each of these three regions is given by FIG. 17. Thus, the diode element 104 has both the features of the diode elements 102 and 103. Therefore, it is possible to obtain a mean value for each parameter shown in FIG. 33.

<5. Variant>

Referring to the diode according to the first embodiment, it is also possible to employ a configuration in which the semiconductor substrate 20 does not comprise the N⁺ layer 3. In this case, the N⁻ layer 21 is exposed to the lower main surface of the semiconductor substrate 20 and the cathode electrode 5 is directly connected to the N⁻ having such a structure and a distribution of a density of life time killers to be introduced.

Figure 35:
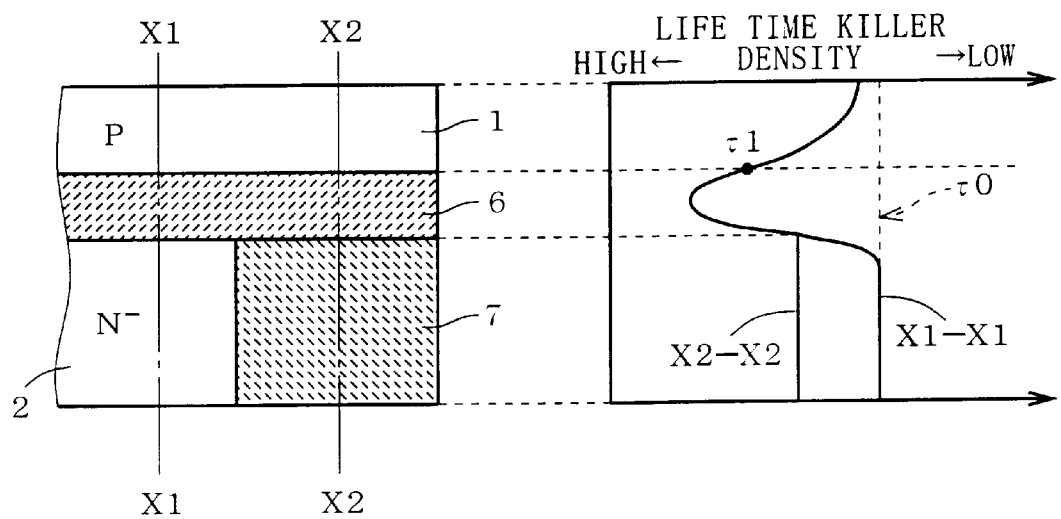
FIG. 35 is a graph showing a profile of a life time killer density according to a variant.
Figure 36:
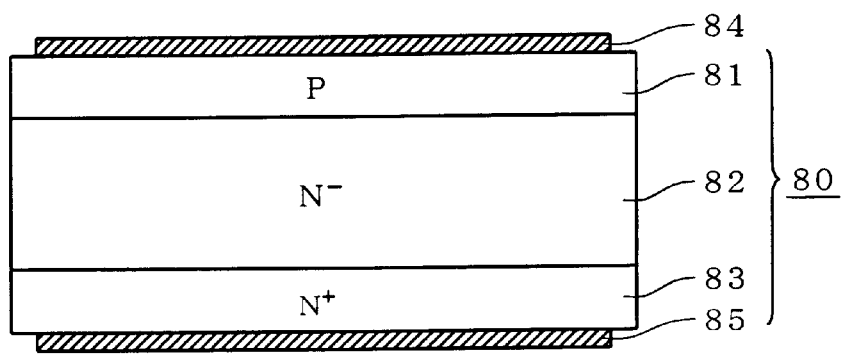
FIG. 36 is a sectional front view showing a diode according to the prior art.
Figure 37:
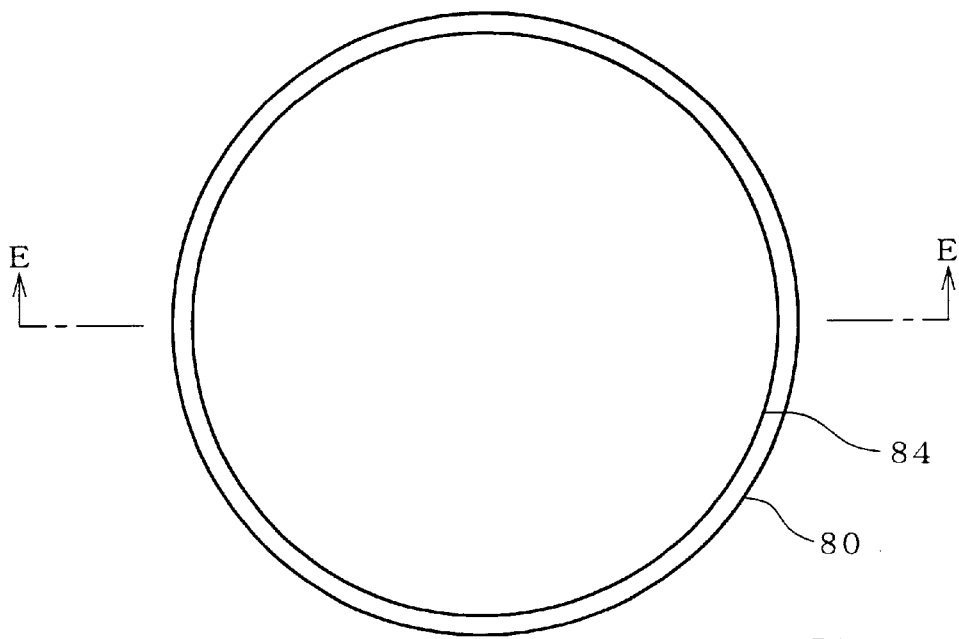
FIG. 37 is a plan view showing the diode according to the prior art.

As shown in FIG. 35, the distribution of the density of the life time killers on the N⁻ layer 21 is equal to that on the N⁻ layer 21 according to the first embodiment shown in FIG. 3. As a result, the N⁻ layer 21 has a first region 6, a second region 7 and a third region 2 formed thereon in the same manner as the N⁻ layer 21 of the diode element 101.

Also in a device having such a structure, it is possible to simultaneously implement a higher di/dt capability, a lower reverse recovery loss and a lower forward voltage than in a conventional device comprising no N⁺ layer 3 in the same manner as the device according to the first embodiment. Furthermore, the voltage oscillation can be suppressed in the process of a reverse recovery operation. Since the device according to the first embodiment comprises the N⁺ layer 3, it is more excellent in that a punch through can be suppressed to raise a breakdown voltage with the semiconductor substrate 20 set thin.

While the present invention has been described in detail, the above description is illustrative in all aspects and the present invention is not restricted thereto. It will be understood that numerous variants which are not illustrated can be supposed without departing from the scope of the invention.

What is claimed is:

1. A diode comprising:

a semiconductor substrate (20) defining an upper main surface and a lower main surface;

a first main electrode (4) connected to said upper main surface; and a second main electrode (5) connected to said lower main surface, said semiconductor substrate including first and second semiconductor layers (1, 21) sequentially provided from said upper main surface toward said lower main surface, said first semiconductor layer (1) having a first conductivity type and being exposed to said upper main surface, said second semiconductor layer (21) having a second conductivity type and forming a PN junction together with said first semiconductor layer, said second semiconductor layer being divided into first, second and third regions (6, 7, 2), said first region (6) facing said first semiconductor layer, and said second region (7) and said third region (2) occupying a portion in said second semiconductor layer which is adjacent to said first region and is close to said lower main surface, and dividing said portion each other in a direction parallel with said upper main surface, wherein a life time of carriers in said second semiconductor layer is set shorter in said first region and said second region than in said third region.

2. The diode according to claim 1, wherein said semiconductor substrate further includes a third semiconductor layer (3) which is adjacent to said second semiconductor layer and is exposed to said lower main surface, said third semiconductor layer having a second conductivity type and a higher impurity concentration than said second semiconductor layer.

3. The diode according to claim 1, wherein said life time is set longer in said second region than in said first region.

4. The diode according to claim 1, wherein a ratio of said second region to said third region is 50% or more.

5. The diode according to claim 1, wherein said second region is divided into a plurality of unit regions (7) in said direction parallel with said upper main surface.

6. The diode according to claim 1, wherein said portion of said second semiconductor layer is divided into a plurality of regions arranged from a center toward an outside in said direction parallel with said upper main surface in such a manner that one of said regions is sequentially surrounded by a next one, and said second region and said third region are alternately arranged in each of said regions.

7. A diode comprising:

a semiconductor substrate (20) defining an upper main surface and a lower main surface;

a first main electrode (4) connected to said upper main surface; and a second main electrode (5) connected to said lower main surface, said semiconductor substrate including first, second and third semiconductor layers (1, 21, 3) sequentially provided from said upper main surface toward said lower main surface, said first semiconductor layer (1) having a first conductivity type and being exposed to said upper main surface, said second semiconductor layer (21) having a second conductivity type and forming a PN junction together with said first semiconductor layer, said third semiconductor layer (3) having a second conductivity type, having a higher impurity concentration than said second semiconductor layer, and being exposed to said lower main surface, said second semiconductor layer being sequentially divided into first, second and third regions (6, 31, 32) from said first semiconductor layer toward said third semiconductor layer, and a boundary interface between said second semiconductor layer and said third semiconductor layer including a portion (30) retreating toward said lower main surface so that said third semiconductor layer includes a thick portion (33) and a thin portion (34), wherein a life time of carriers in said second semiconductor layer is set shorter in said second region than in said third region, and is set shorter in said first region than in said second region.

8. The diode according to claim 7, wherein a ratio of an area occupied by a region where said thin portion is projected to said lower main surface is set to 50% or less.

9. The diode according to claim 7, wherein said thin portion is divided into a plurality of portions (34) which are uniformly arranged at regular intervals along id lower main surface.

10. The diode according to claim 7, wherein a maximum diameter of ch of said plurality of portions along said lower main surface is set to 50 μm or less.

11. The diode according to claim 7, wherein a distance (d1) from a boundary between said second region and said third region to said lower main surface is set smaller than a thickness (d2) of said thick portion.

12. A diode comprising:

a semiconductor substrate (20) defining an upper main surface and a lower main surface;

a first main electrode (4) connected to said upper main surface; and a second main electrode (5) connected to said lower main surface, said semiconductor substrate including first, second and third semiconductor layers (1, 21, 3) sequentially provided from said upper main surface toward said lower main surface, said first semiconductor layer (1) having a first conductivity type and being exposed to said upper main surface, said second semiconductor layer (21) having a second conductivity type and forming a PN junction together with said first semiconductor layer, said third semiconductor layer (3) having a second conductivity type, having a higher impurity concentration than said second semiconductor layer, and being exposed to said lower main surface, said second semiconductor layer being sequentially divided into first, second and third regions (53, 54, 55) from said first semiconductor layer toward said third semiconductor layer, and a boundary surface between said first semiconductor layer and said second semiconductor layer including a portion (50) retreating toward said upper main surface so that said first semiconductor layer includes a thick portion (52) and a thin portion (51), wherein a life time of carriers in said second semiconductor layer is set shorter in said second region than in said third region, and is set shorter in said first region than in said second region.

13. The diode according to claim 12, wherein a ratio of an area occupied by a region where said thin portion is projected to said upper main surface is set to 50% or less.

14. The diode according to claim 12, wherein said thin portion is divided into a plurality of portions (51) which are uniformly arranged at regular intervals along said lower main surface.

15. The diode according to claim 12, wherein a maximum diameter of each of said plurality of portions along said upper main surface is set to 50 μm or less.

16. The diode according to claim 12, wherein a distance (d4) from a boundary between said first region and said second region to said upper main surface is set larger than a thickness (d5) of said thick portion.

17. The diode according to claim 12, wherein a boundary surface between said second semiconductor layer and said third semiconductor layer includes a portion (30) retreating toward said lower main surface so that said third semiconductor layer includes a thick portion (33) and a thin portion (34).

* * * * *